US012653017B2

(12) United States Patent
Choi et al.

(10) Patent No.: US 12,653,017 B2
(45) Date of Patent: Jun. 9, 2026

(54) INTERCONNECT STRUCTURE OF SEMICONDUCTOR DEVICE INCLUDING METAL PATTERN OR VIA STRUCTURE WITH SIDEWALL SPACER STRUCTURE

(71) Applicant: SAMSUNG ELECTRONICS CO., LTD., Suwon-si (KR)

(72) Inventors: Jaemyung Choi, Niskayuna, NY (US); Tae Sun Kim, Ballston Spa, NY (US); Janggeun Lee, Delmar, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 567 days.

(21) Appl. No.: 17/883,073

(22) Filed: Aug. 8, 2022

(65) Prior Publication Data

US 2023/0343698 A1 Oct. 26, 2023

Related U.S. Application Data

(60) Provisional application No. 63/335,091, filed on Apr. 26, 2022, provisional application No. 63/334,939, filed on Apr. 26, 2022.

(51) Int. Cl.
*H10W 20/42* (2026.01)
*H10W 20/00* (2026.01)
(Continued)

(52) U.S. Cl.
CPC ......... *H10W 20/42* (2026.01); *H10W 20/075* (2026.01); *H10W 20/077* (2026.01);
(Continued)

(58) Field of Classification Search
CPC ........... H01L 23/5226; H01L 21/76807; H01L 21/76832; H01L 21/76834;
(Continued)

(56) References Cited

U.S. PATENT DOCUMENTS 7,109,551 B2 * 9/2006 Sugi ...................... H10D 86/01
257/370
9,368,362 B2 6/2016 Rha et al.
(Continued)

FOREIGN PATENT DOCUMENTS

| DE | 10 2019 131 408 A1 | 12/2020 |
| WO | 2018/063337 A1 | 4/2018 |
| WO | 2020/112388 A1 | 6/2020 |

OTHER PUBLICATIONS

The Extended European Search Report issued Oct. 19, 2023 by the European Patent Office for European Patent Application No. 23169470.4.

*Primary Examiner* — Yasser A Abdelaziez
(74) *Attorney, Agent, or Firm* — Myers Bigel, P.A.

(57) ABSTRACT

Provided is a semiconductor device including at least one front-end-of-line (FEOL) element connected to an interconnect structure, the interconnect structure including: a $1^{st}$ metal pattern or via structure with a spacer structure on a sidewall thereof; and a $1^{st}$ interlayer dielectric (ILD) layer formed at sides of the $1^{st}$ metal pattern or via structure with the spacer structure on the sidewall thereof, wherein the spacer structure includes a dielectric material different from a material included in the $1^{st}$ ILD layer.

20 Claims, 19 Drawing Sheets

400

(51) Int. Cl.
| | |
|---|---|
| *H10W 20/41* | (2026.01) |
| *H10W 20/44* | (2026.01) |
| *H10W 20/47* | (2026.01) |

(52) U.S. Cl.
CPC ........ H10W 20/084 (2026.01); *H10W 20/033* (2026.01); *H10W 20/425* (2026.01); *H10W 20/4441* (2026.01); *H10W 20/47* (2026.01)

(58) Field of Classification Search
CPC ......... H01L 21/76843; H01L 23/53238; H01L 23/53257; H01L 23/53295; H01L 21/76837; H01L 23/53242; H01L 23/5329; H01L 21/76897; H01L 21/76877; H01L 23/5283; H10W 20/42; H10W 20/075; H10W 20/077; H10W 20/084; H10W 20/033; H10W 20/425; H10W 20/4441; H10W 20/47; H10W 20/438; H10W 20/4432; H10W 20/098; H10W 20/48; H10W 20/056; H10W 20/069; H10W 20/435
See application file for complete search history.

(56) References Cited

U.S. PATENT DOCUMENTS

| | | | |
|---|---|---|---|
| 10,199,325 | B2 | 2/2019 | Yim et al. |
| 10,319,629 | B1 | 6/2019 | Yang et al. |
| 10,777,452 | B2 | 9/2020 | Ho et al. |
| 10,867,905 | B2 | 12/2020 | Wang et al. |
| 11,164,815 | B2 | 11/2021 | Cheng et al. |
| 11,276,611 | B2 | 3/2022 | Anderson et al. |
| 11,276,638 | B2 | 3/2022 | Huang et al. |
| 2005/0029662 | A1* | 2/2005 | Nakano ............. H01L 21/76849 257/E21.174 |
| 2006/0192286 | A1* | 8/2006 | Kanamura ........ H01L 21/76808 257/E21.579 |
| 2008/0079167 | A1* | 4/2008 | Yang ................. H01L 23/53238 257/763 |
| 2011/0092019 | A1* | 4/2011 | Yu .......................... H01L 23/485 438/653 |
| 2015/0187696 | A1 | 7/2015 | Tsai et al. |
| 2017/0179021 | A1 | 6/2017 | Cheng et al. |
| 2019/0267279 | A1 | 8/2019 | Cheng et al. |
| 2019/0355621 | A1 | 11/2019 | Marcadal et al. |
| 2020/0126857 | A1* | 4/2020 | Tsai ..................... H10D 64/017 |
| 2020/0312708 | A1* | 10/2020 | Fu ..................... H01L 21/76805 |
| 2021/0090952 | A1 | 3/2021 | Freed et al. |
| 2021/0184008 | A1* | 6/2021 | Cheng ................. H10D 30/024 |
| 2021/0193513 | A1 | 6/2021 | Tien et al. |
| 2021/0375749 | A1* | 12/2021 | Yang ................. H10W 20/056 |
| 2022/0020688 | A1 | 1/2022 | Xie et al. |
| 2022/0037205 | A1 | 2/2022 | Anderson et al. |
| 2022/0319922 | A1* | 10/2022 | Wu ..................... H01L 23/5226 |
| 2023/0062416 | A1* | 3/2023 | Wu ..................... H10D 62/115 |

* cited by examiner

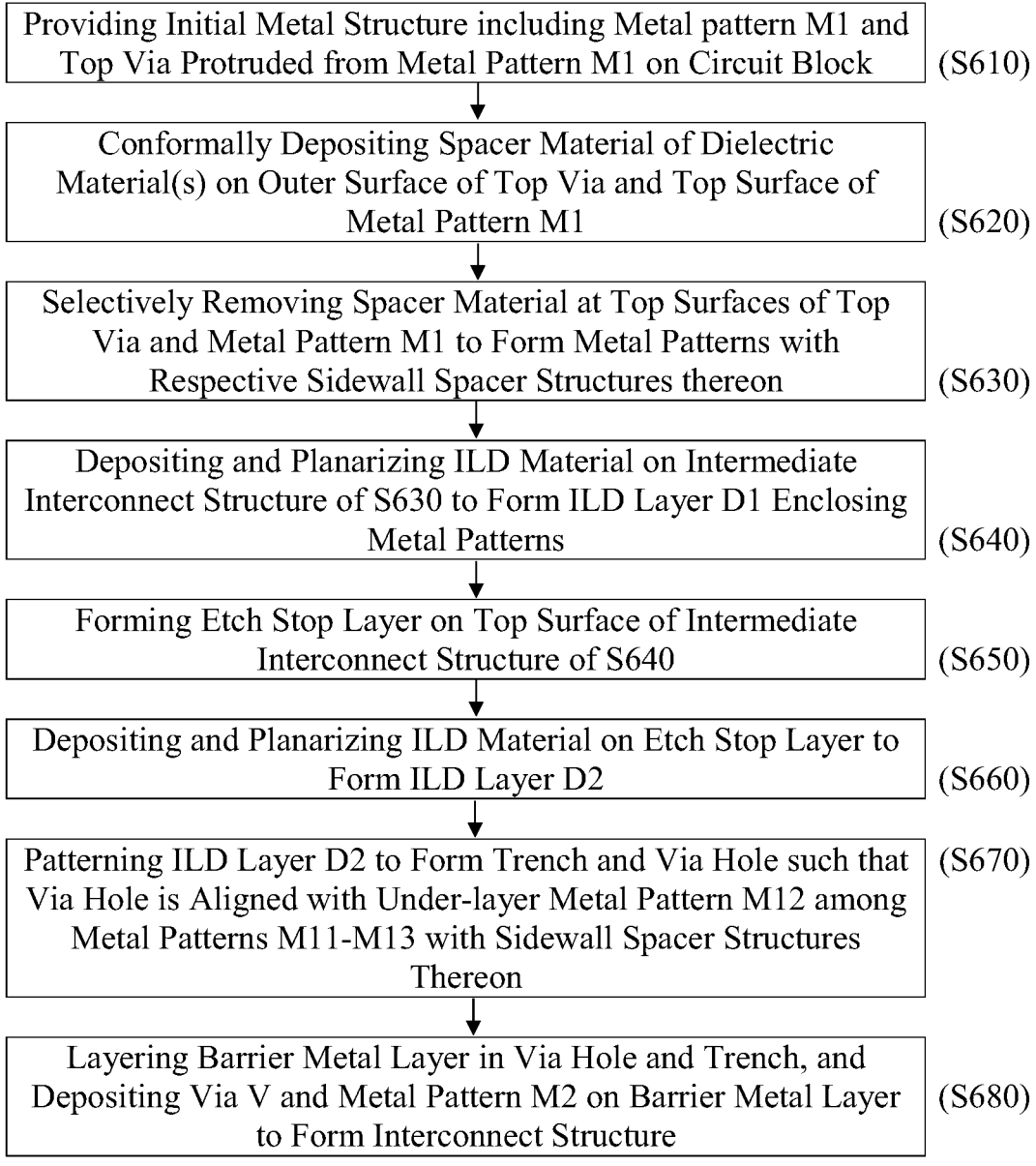

| | |
|---|---|
| Providing Initial Metal Structure including Metal pattern M1 and Top Via Protruded from Metal Pattern M1 on Circuit Block | (S610) |
| Conformally Depositing Spacer Material of Dielectric Material(s) on Outer Surface of Top Via and Top Surface of Metal Pattern M1 | (S620) |
| Selectively Removing Spacer Material at Top Surfaces of Top Via and Metal Pattern M1 to Form Metal Patterns with Respective Sidewall Spacer Structures thereon | (S630) |
| Depositing and Planarizing ILD Material on Intermediate Interconnect Structure of S630 to Form ILD Layer D1 Enclosing Metal Patterns | (S640) |
| Forming Etch Stop Layer on Top Surface of Intermediate Interconnect Structure of S640 | (S650) |
| Depositing and Planarizing ILD Material on Etch Stop Layer to Form ILD Layer D2 | (S660) |
| Patterning ILD Layer D2 to Form Trench and Via Hole such that Via Hole is Aligned with Under-layer Metal Pattern M12 among Metal Patterns M11-M13 with Sidewall Spacer Structures Thereon | (S670) |
| Layering Barrier Metal Layer in Via Hole and Trench, and Depositing Via V and Metal Pattern M2 on Barrier Metal Layer to Form Interconnect Structure | (S680) |

FIG. 8

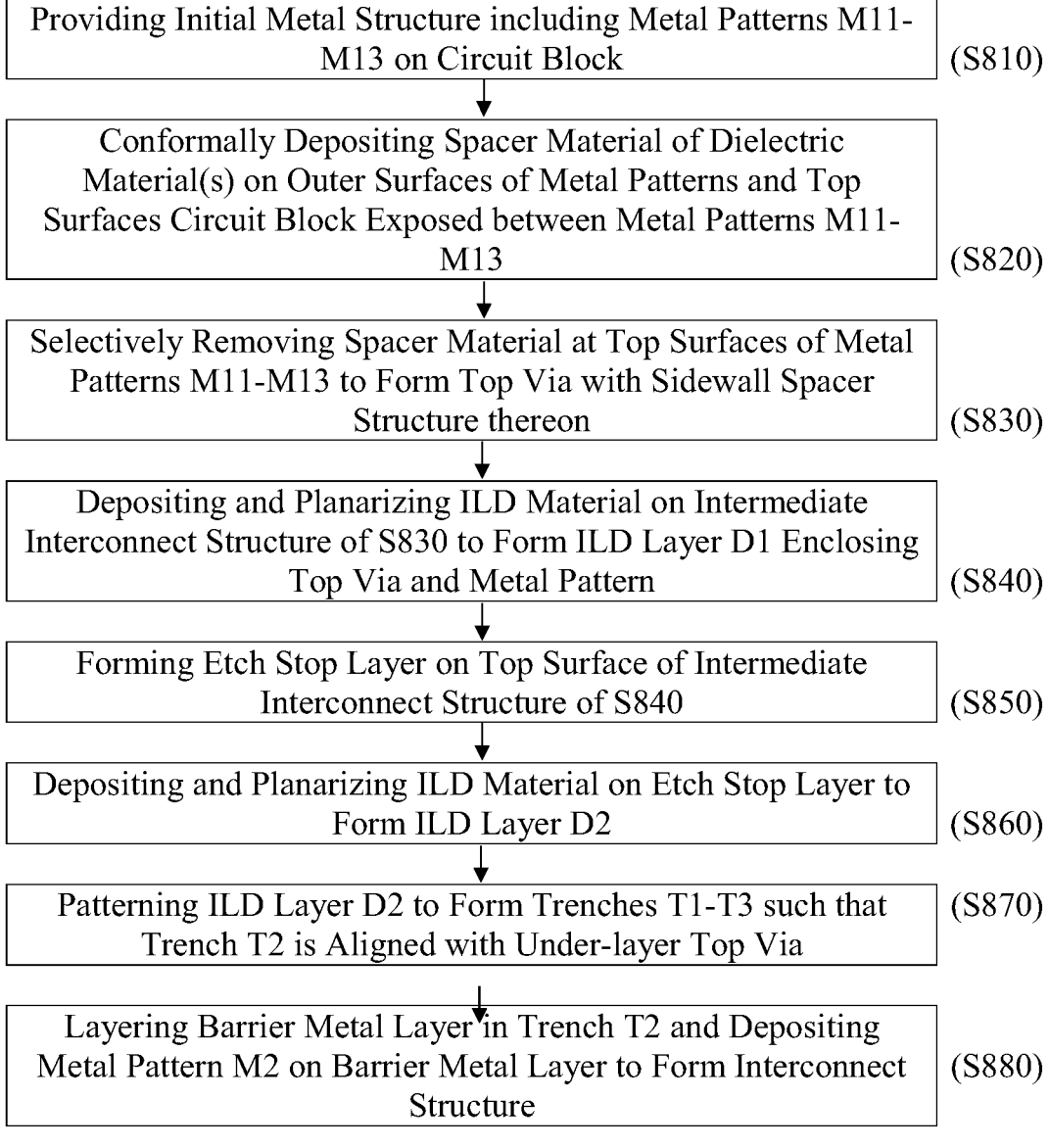

| | |
|---|---|
| Providing Initial Metal Structure including Metal Patterns M11-M13 on Circuit Block | (S810) |
| Conformally Depositing Spacer Material of Dielectric Material(s) on Outer Surfaces of Metal Patterns and Top Surfaces Circuit Block Exposed between Metal Patterns M11-M13 | (S820) |
| Selectively Removing Spacer Material at Top Surfaces of Metal Patterns M11-M13 to Form Top Via with Sidewall Spacer Structure thereon | (S830) |
| Depositing and Planarizing ILD Material on Intermediate Interconnect Structure of S830 to Form ILD Layer D1 Enclosing Top Via and Metal Pattern | (S840) |
| Forming Etch Stop Layer on Top Surface of Intermediate Interconnect Structure of S840 | (S850) |
| Depositing and Planarizing ILD Material on Etch Stop Layer to Form ILD Layer D2 | (S860) |
| Patterning ILD Layer D2 to Form Trenches T1-T3 such that Trench T2 is Aligned with Under-layer Top Via | (S870) |
| Layering Barrier Metal Layer in Trench T2 and Depositing Metal Pattern M2 on Barrier Metal Layer to Form Interconnect Structure | (S880) |

FIG. 10

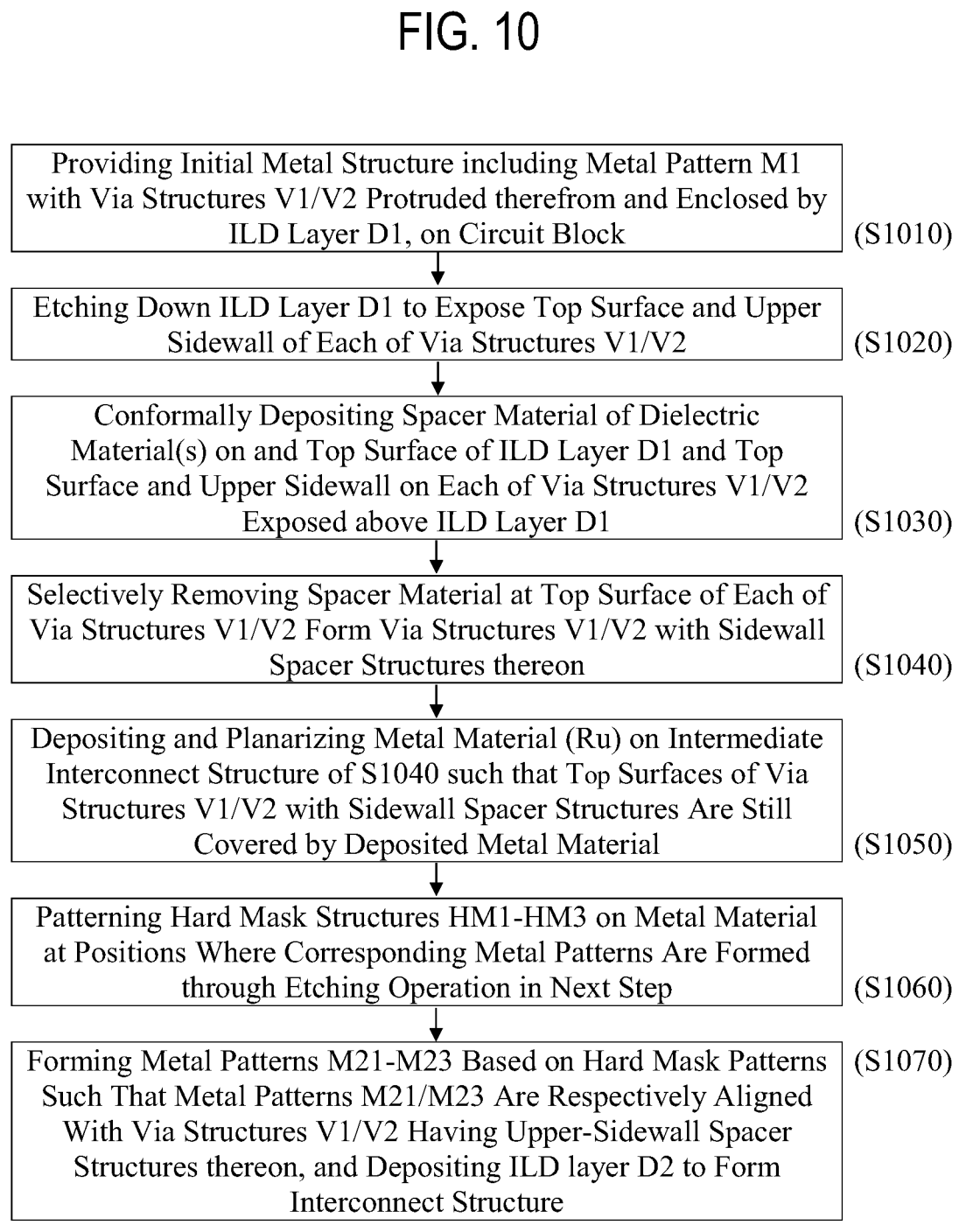

Providing Initial Metal Structure including Metal Pattern M1 with Via Structures V1/V2 Protruded therefrom and Enclosed by ILD Layer D1, on Circuit Block     (S1010)

Etching Down ILD Layer D1 to Expose Top Surface and Upper Sidewall of Each of Via Structures V1/V2     (S1020)

Conformally Depositing Spacer Material of Dielectric Material(s) on and Top Surface of ILD Layer D1 and Top Surface and Upper Sidewall on Each of Via Structures V1/V2 Exposed above ILD Layer D1     (S1030)

Selectively Removing Spacer Material at Top Surface of Each of Via Structures V1/V2 Form Via Structures V1/V2 with Sidewall Spacer Structures thereon     (S1040)

Depositing and Planarizing Metal Material (Ru) on Intermediate Interconnect Structure of S1040 such that Top Surfaces of Via Structures V1/V2 with Sidewall Spacer Structures Are Still Covered by Deposited Metal Material     (S1050)

Patterning Hard Mask Structures HM1-HM3 on Metal Material at Positions Where Corresponding Metal Patterns Are Formed through Etching Operation in Next Step     (S1060)

Forming Metal Patterns M21-M23 Based on Hard Mask Patterns Such That Metal Patterns M21/M23 Are Respectively Aligned With Via Structures V1/V2 Having Upper-Sidewall Spacer Structures thereon, and Depositing ILD layer D2 to Form Interconnect Structure     (S1070)

INTERCONNECT STRUCTURE OF SEMICONDUCTOR DEVICE INCLUDING METAL PATTERN OR VIA STRUCTURE WITH SIDEWALL SPACER STRUCTURE

CROSS-REFERENCE TO RELATED APPLICATION

This application is based on and claims priority from U.S. Provisional Application Nos. 63/335,091 and 63/334,939 filed on Apr. 26, 2022 in the U.S. Patent and Trademark Office, the disclosures of which are incorporated herein in its entirety by reference.

BACKGROUND

1. Field

Apparatuses and methods consistent with example embodiments of the disclosure relate to an interconnect structure, and more particularly to an interconnect structure including a spacer structure formed on a sidewall of a metal pattern or via structure.

2. Description of Related Art

Over the years, semiconductor devices including transistors have decreased dramatically in size while their performance has significantly improved. As semiconductor devices have become smaller and smaller, interconnect structures included in the semiconductor devices have also had to scale down in size.

The interconnect structure generally includes, as interconnect element, one or more metal patterns and vias, and an interlayer dielectric (ILD) layer isolating the metal patterns and vias from one another or other circuit elements. The interconnect structure may form a back-end-of-line (BEOL) and/or a middle-of-line (MOL) of a semiconductor device included in an integrated circuit (IC) such as a logic circuit, a memory flip-flop or a latch circuit to receive and output signals for the semiconductor device.

A metal pattern of the interconnect structure may be a BEOL element such as a power line connected to a voltage source (Vdd or Vss) through a via to receive a positive voltage or a negative voltage supplied to the semiconductor device. The metal pattern may also be an MOL element such as a gate contact structure connected to a gate electrode of a transistor or a source/drain contact structure connected to a source/drain region of the transistor included in the semiconductor device.

The metal lines and vias in the ILD layer may be formed of the same or different metals or metal compounds including at least one of copper (Cu), titanium (Ti), tantalum (Ta), aluminum (Al), tungsten (W), cobalt (Co), molybdenum (Mo), ruthenium (Ru), etc. The ILD layer may be formed of a low-k dielectric material(s) such as silicon oxide or silicon nitride having a dielectric constant (k value) of about 3.9 or less.

Copper (Cu) has been dominantly used as a metal pattern due to its low electric resistance. However, copper has disadvantages at least in that it tends to leach into a surrounding ILD layer to deteriorate isolation (or insulation) properties of the ILD layer. Thus, when copper is filled in a trench or via hole to form a metal pattern or via, a barrier metal layer is layered in the trench or via hole to prevent diffusion of the copper into the ILD layer, which, however, reduces an area that the metal pattern occupies in the trench or via hole, thereby affecting a conduction capability of an interconnect structure including the copper metal pattern. Recently, ruthenium (Ru) or molybdenum (Mo) that can address the above problems of copper began to be used as a metal pattern for interconnect structures because the these metals may not need to have the barrier metal layer on their side surfaces contacting the ILD layer.

However, as an interconnect structure is formed of a plurality of layers in each of which different metal patterns and vias are formed and connected to one another, interconnection properties also affect performance of an integrated circuit in that various signals and power are transmitted through the interconnect structure. For example, the interconnection properties include a degree of alignment of a metal pattern or via with an under-layer via or metal pattern, isolation characteristics of the ILD layer, an isolation space margin between the metal pattern or via and another under-layer via or metal pattern adjacent to the under-layer via or metal pattern, and an isolation space margin between over-layer metal patterns or over-layer vias adjacent to each other. Thus, integrity of interconnect structures has been emphasized more than ever to improve performance of an integrated circuit.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides a connection structure for an integrated circuit which includes a spacer via structure, and a method of manufacturing the connection structures.

According to embodiments, there is provided a semiconductor device including at least one front-end-of-line (FEOL) element connected to an interconnect structure which may include: a $1^{st}$ metal pattern or via structure with a spacer structure on a sidewall thereof; and a $1^{st}$ interlayer dielectric (ILD) layer formed at sides of the $1^{st}$ metal pattern or via structure with the spacer structure on the sidewall thereof, wherein the spacer structure includes a dielectric material different from a material included in the $1^{st}$ ILD layer.

According to embodiments, the dielectric material of the spacer structure has a dielectric constant greater than that of a material included in the $1^{st}$ ILD layer.

According to an embodiment, the interconnect structure may further include $2^{nd}$ via structure or metal pattern formed above the $1^{st}$ metal pattern or via structure, herein the $2^{nd}$ via structure or metal pattern is vertically aligned with and connected to the $1^{st}$ metal pattern or via structure, respectively.

According to embodiments, there is provided a semiconductor device including at least one front-end-of-line (FEOL) element connected to an interconnect structure which may include a metal pattern or via structure with a spacer structure on a sidewall thereof, wherein the spacer structure is formed between the sidewall of the $1^{st}$ metal pattern or via structure and an isolation structure formed of a material different from a material forming the spacer structure.

According to embodiments, there is provided a method of manufacturing an interconnect structure of a semiconductor device, which may include: providing a lower metal pattern or via structure; forming a spacer structure on a sidewall of the lower metal pattern or via structure; enclosing the lower metal pattern or via structure with the spacer structure on the sidewall thereof with an ILD layer; forming another ILD layer above the ILD layer and lower metal pattern or via structure; patterning the other ILD layer to form a via hole or trench aligned with the lower metal pattern or via structure; and filling a metal material in the via hole or trench.

BRIEF DESCRIPTION OF DRAWINGS

Example embodiments of the disclosure will be more clearly understood from the following detailed description taken in conjunction with the accompanying drawings in which.

DETAILED DESCRIPTION OF EMBODIMENTS

Figure 1A:
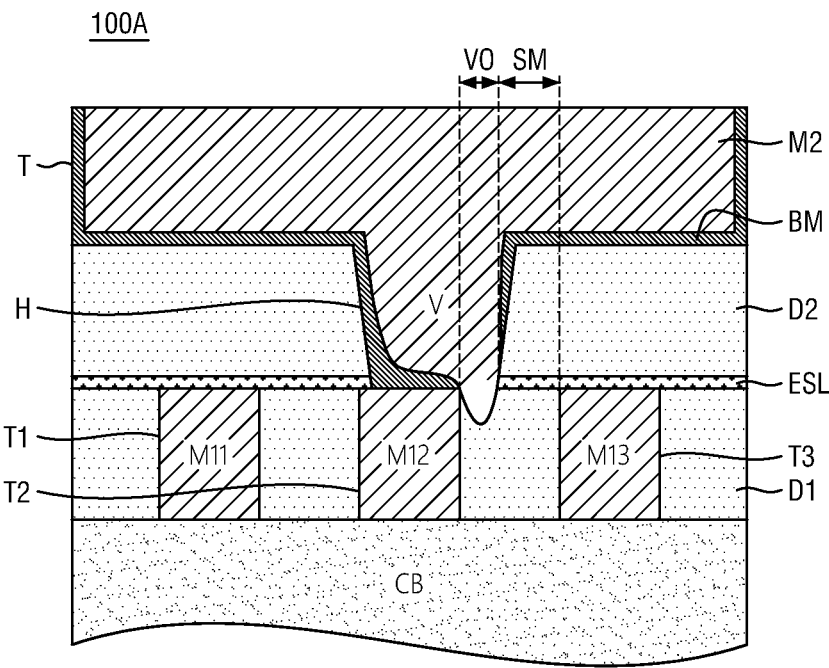
FIG. 1A illustrates a cross-sectional view of an interconnect structure in which a via is misaligned with an under-layer metal pattern, according to an embodiment.

The embodiments of the disclosure described herein are example embodiments, and thus, the disclosure is not limited thereto, and may be realized in various other forms. Each of the embodiments provided in the following descriptions is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a material or materials forming a metal line or a via may not be limited to metals of which examples are taken herein as long as the disclosure can be applied thereto. Further, the use of the via structure or the via scheme described herein may not be limited to a BEOL or MOL of a semiconductor device, and instead, may be applied to a different structure or device.

It will be understood that when an element, component, layer, pattern, structure, region, or so on (hereinafter collectively "element") of a semiconductor device is referred to as being "over," "above," "on," "below," "under," "beneath," "connected to" or "coupled to" another element in the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there may be no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

It is understood that, in the descriptions below and the accompanying drawings, an element, component, layer, pattern, structure or region indicated by same reference numbers or reference characters in various embodiments may refer to the same or different element, component, layer, pattern, structure or region. For example, a metal pattern M1 in FIG. 1B, a metal pattern M1 in FIG. 2B, and a metal pattern M1 in FIG. 3A and FIG. 3B may be the same one or different ones.

In the descriptions herein, the term "via" refers to or is interchangeably used with a via structure, via pattern or a via plug which is formed or filled in a via hole to connect two or more metal patterns formed at vertically stacked layers or levels. Also, the "metal pattern" refers to or is interchangeably used with a metal line or a metal structure.

FIG. 1A illustrates a cross-sectional view of an interconnect structure in which a via is misaligned with an under-layer metal pattern, according to an embodiment.

An interconnect structure 100A shown in FIG. 1A may include a plurality of metal patterns M11-M13, a via V formed in a via hole H above the metal pattern M12, a metal pattern M2 formed in a trench T and connected to the via V, and ILD layers D1 and D2 respectively enclosing these interconnect elements for isolation thereof from other circuit elements.

The interconnect structure 100A may also include a barrier metal layer BM layered on the trench T and the connected via hole H to prevent diffusion of a metal material(s) forming the metal pattern M2 and the via V into the ILD layer D2. Although not shown in the drawings, a contact liner facilitating deposition of the metal material(s) in the trench T and the via hole H may also be layered thereon. The interconnect structure 100A may further include an etch stop layer ESL layered on top surfaces of the ILD layer D1 and the metal patterns M11-M13. This etch stop layer ESL may be used for etching the via hole H in the ILD layer D2, and remain in the interconnect structure 100A.

The interconnect structure 100A may be connected to a circuit block CB of an integrated circuit thereunder. As described earlier, the interconnect structure 100A may form a back-end-of-line (BEOL) or middle-of-line (MOL) of a semiconductor device, the circuit block CB may include one or more BEOL, MOL or front-end-of-line (FEOL) elements of the semiconductor device.

As described earlier, the metal patterns M11-M13, M2 and the via V may be formed of one or more metals or metal compounds such as copper (Cu), titanium (Ti), tantalum (Ta), aluminum (Al), tungsten (W), cobalt (Co), molybdenum (Mo), ruthenium (Ru), etc. The ILD layers D1 and D2 may be formed of a material(s) having a dielectric constant (κ-value) of about 3.9 or less. Silicon oxide (e.g., $SiO_2$) may be used as the ILD layers L1 and L2. The barrier metal layer BM may include cobalt (Co) or tantalum (Ta), and the etch stop layer may include aluminum nitride (AlN) or silicon carbon nitride (SiCN), not being limited thereto.

A material forming the metal pattern M2 and the via V may be copper while the metal patterns M11-M13 may be formed of ruthenium, not being limited thereto, according to an embodiment. The metal pattern M2 and the via V may be formed through a dual damascene operation, while the metal patterns M11-M13 may be formed through photolithography and etching (e.g., dry and/or wet etching), not being limited thereto, according to an embodiment.

When the metal patterns M11-M13 is formed of ruthenium (Ru) that does not need a barrier metal layer, the ILD layer D1 may be simply deposited on the metal patterns M11-M13 through, for example, physical vapor deposition (PVD), chemical vapor deposition (CVD), plasma enhanced CVD (PECVD) and/or electroplating, not being limited thereto, according to an embodiment. In contrast, the metal pattern M12 and the via V including copper may be formed by a dual damascene operation, and thus, the barrier metal layer BM may be layered in the trench T and the connected via hole H to prevent diffusion of the copper into the ILD layer D2, according to an embodiment.

However, in the interconnect structure 100, the via hole H may be etched in the ILD layer D2 such that the via hole H is not properly aligned with the under-layer metal pattern M12 by a via hole offset VO, which often occurs in via hole etching operations (e.g. dry and/or wet etching) performed for nanoscale interconnect structures. By this via hole offset VO, the via hole H may erode the top surface of the ILD layer D1 to form an unintended groove (or hole) on the ILD layer D1 around an upper-right edge of the metal pattern M12. Thus, the barrier metal layer BM may not be conformally layered in the via hole H, which may subsequently prevent the via V from sufficiently filling the via hole H. This may lead to generation of a void in the via V H causing discontinuity of current flow between the metal pattern M12 and M2 through the via V. Further, the unintended groove formed in the ILD layer D1 may physically damage the ILD layer D1 and degrade isolation characteristics of the ILD layer D1. Further, because of this misalignment, via hole offset VO and ILD damage, the misaligned via V in the via hole H extends to the right, in this example, toward the under-layer metal pattern M13 adjacent to the under-layer M12 connected to the via H, and thus, an isolation space margin (or isolation distance) SM between the via V and the under-layer metal pattern M13 becomes smaller, which may increase a short-circuit risk for the circuit block CB thereunder. These problems may also occur in different types of interconnect structure as below.

Figure 1B:
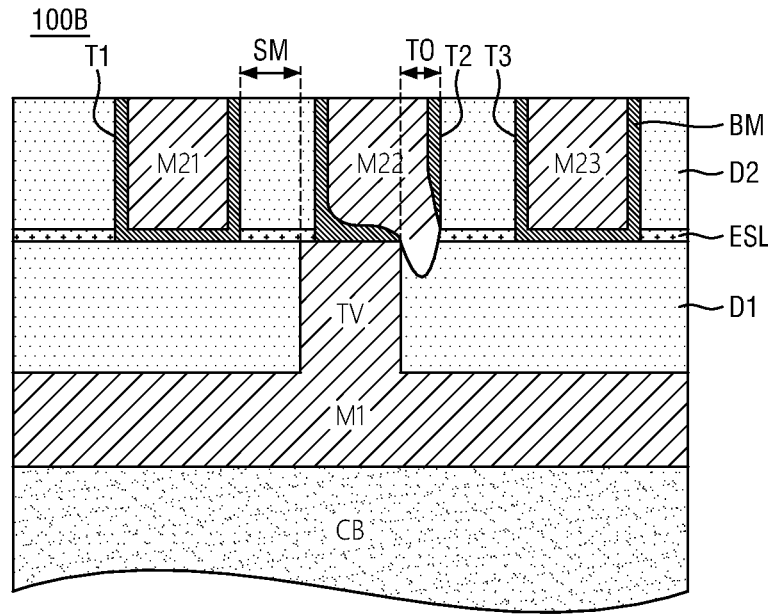
FIG. 1B illustrates a cross-sectional view of an interconnect structure in which a metal pattern is misaligned with an under-layer top via, according to an embodiment.

FIG. 1B illustrates a cross-sectional view of an interconnect structure in which a metal pattern is misaligned with an under-layer top via, according to an embodiment.

An interconnect structure 100B shown in FIG. 1B may include a metal pattern M1, on which a top via TV is protruded therefrom, a plurality of metal patterns M21-M23 in respective trenches T1-T3, and ILD layers D1 and D2 respectively enclosing these interconnect elements for isolation thereof from other circuit elements.

The interconnect structure 100B may also include a barrier metal layer BM layered on the trenches T1-T3 to prevent diffusion of a metal material(s) forming the metal patterns M21-M23 into the ILD layer D2. Although not shown in the drawings, a contact liner facilitating deposition of the metal material(s) in the trenches T1-T3 may also be layered thereon. The interconnect structure 100B may further include an etch stop layer ESL layered on top surfaces of the ILD layer D1 and the top via TV. This etch stop layer ESL may be used for etching the trenches T1-T3 in the ILD layer D2, and remain in the interconnect structure 100B.

The circuit block CB shown in FIG. 1B may be the same or similar to the circuit block CB shown in FIG. 1A, and thus, duplicate descriptions thereof are omitted herein.

The metal pattern M1, M21-M23 and the top via, the ILD layers D1, D2, the barrier metal layer BM, and the etch stop layer ESL in the interconnect structure 100B may be formed of the same or similar materials of the metal pattern M11-M13, M2 and the via V, the ILD layers D1, D2, the barrier metal layer BM, and the etch stop layer ESL in the interconnect structure 100A, and thus, duplicate descriptions thereof are omitted herein.

A material forming the metal patterns M21-M23 may be copper while the metal pattern M1 and the top via may be formed of ruthenium (Ru), not being limited thereto, according to an embodiment. The metal patterns M21-M23 may be formed through a single damascene operation. In contrast, the metal pattern M1 and the top via TV may be formed a single metal structure through photolithography and etching (e.g., dry and/or wet etching), not being limited thereto, and thus, the metal pattern M1 and the top via TV may be a single continuous structure without having a connection surface therebetween, according to an embodiment.

When the metal pattern M1 and the top via TV is formed of ruthenium (Ru) that does not need a barrier metal layer, the ILD layer D1 may be simply deposited on the metal patterns M11-M13 through, for example, PVD, CVD, PECVD and/or electroplating, not being limited thereto, according to an embodiment. In contrast, the metal patterns M21-M23 including copper may be formed by a single damascene operation, and thus, the barrier metal layer BM may be layered in the trenches T1-T3 to prevent diffusion of the copper into the ILD layer D2, according to an embodiment.

However, similar to the interconnect structure 100A, the interconnect structure 100B in FIG. 1B shows that the trench T2 may be etched in the ILD layer D2 such that the trench T2 is not properly aligned with the under-layer top via TV by a trench offset TO, which often occurs in trench etching operations (e.g., dry and/or wet etching) performed for nanoscale interconnect structures. By this trench offset TO, the trench T2 may erode a top surface of the ILD layer D1 to form an unintended groove on the ILD layer D1 around an upper-right edge, in this example, of the top via TV. Thus, the barrier metal layer BM may not be conformally layered in the trench T2, which subsequently prevent the metal pattern M22 from sufficiently filling the trench T2. This may lead to generation of a void in metal pattern M22 causing discontinuity of current flow between the metal pattern M22 and M1 through the top via TV. Further, the unintended groove formed in the ILD layer D1 may physically damage the ILD layer D1 and degrade isolation characteristics of the ILD layer D1. Because of these misalignment, trench offset TO and ILD damage, the misaligned metal pattern M21 in the trench T1 may extend to the right, in this example, toward the under-layer top via TV, and thus, an isolation space margin SM between the metal pattern M21 and the top via TV becomes smaller, which may increase a short-circuit risk for the circuit block CB thereunder.

Thus, inventors of the disclosure have come up with further improved interconnect structures as described below.

Figure 2A:
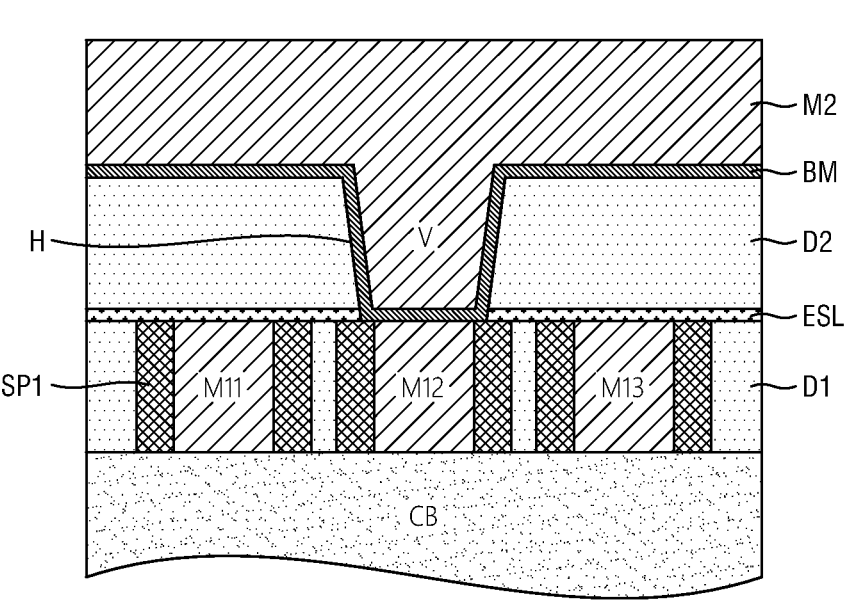
FIG. 2A illustrates a cross-sectional view of an interconnect structure in which a via is aligned with an under-layer metal pattern having a spacer structure on sidewalls thereof, according to an embodiment.
Figure 2B:
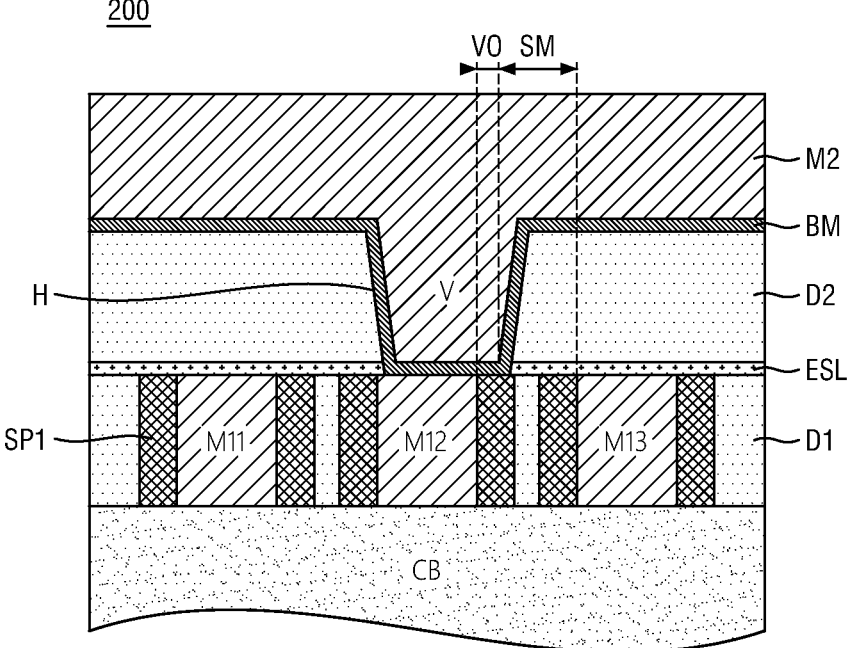
FIG. 2B illustrates a cross-sectional view of the interconnect structure of FIG. 2A in which the via is misaligned with the under-layer metal pattern having the spacer structure on the sidewalls thereof, according to an embodiment.

FIG. 2A illustrates a cross-sectional view of an interconnect structure in which a via is aligned with an under-layer metal pattern having a spacer structure on sidewalls thereof, according to an embodiment. FIG. 2B illustrates a cross-sectional view of the interconnect structure of FIG. 2A in which the via is misaligned with the under-layer metal pattern having the spacer structure on the sidewalls thereof, according to an embodiment.

An interconnect structure 200 shown in FIG. 2A may include a plurality of metal patterns M11-M13, a via V in a via hole H, a metal pattern M2 in a trench T, a barrier metal layer BM, an etch stop layer ESL and ILD layers D1, D2, on a circuit block CB of an integrated circuit, which are the same or similar to those included in the interconnect structure 100A shown in FIG. 1A. These elements of the interconnect structure 200 may include the same or similar materials included in the corresponding elements of the interconnect structure 100A. Further, these elements of the interconnect structure 200 may be formed in a manner that is the same as or similar to that used for the formation of the corresponding elements in the interconnect structure 100A. Thus, duplicate descriptions may be unnecessary herein.

However, according to an embodiment, the interconnect structure 200 may be characterized in that each of the metal pattern M11-M13 has a spacer structure SP1 formed on sidewalls thereof in the ILD layer D1. This sidewall spacer structure SP1 may include a dielectric material such as silicon nitride (e.g., SiN, $Si_3N_4$, SiCN, etc.) having a dielectric constant greater than the material included in the ILD layer D1 such as silicon oxide (e.g., SiO, $SiO_2$, etc.) not being limited thereto, according to an embodiment.

This sidewall spacer structure SP1 may be formed on the sidewalls of each of the metal patterns M11-M13 in the interconnect structure 200 to address the problems of misalignment between the via V an and under-layer metal pattern M12 of the interconnect structure 100A of FIG. 1A.

Thus, as shown in FIG. 2B, when the via V is formed to be misaligned with the under-layer metal pattern M12 in the dual damascene operation, the same or similar via hole offset VO generated in the interconnect structure 100A may be generated. However, as the spacer structure SP1 may be formed on the sidewalls of the metal patterns M12, the via hole offset VO generated from misaligned via hole etching (e.g., dry and/or wet etching) of the ILD layer D1 in the dual damascene operation may be positioned above the spacer structure SP1. Further, as the spacer structure SP1 may be formed of the dielectric material different from that of the ILD layer D1 as described above, it may have sufficient etch selectivity with respect to the ILD layer D1, so as to tolerate, without substantial damage, the via hole etching of the ILD layer D1 in the dual damascene operation for the trench T and the via hole H.

Thus, a top surface of the ILD layer D1 may be protected from the misaligned via hole etching. In other words, the spacer structure SP1 may prevent formation of the unintended groove on the ILD layer D1 by the via hole etching that may occur in the interconnect structure 100A as shown in FIG. 1A. Accordingly, isolation characteristics of the ILD layer D1 may not be degraded due to the spacer structure SP1.

Moreover, as the spacer structure SP1 may also be formed on the sidewalls of the metal pattern M13 as well as the metal pattern M12, a possible short-circuit risk between the via V and the metal patterns M13 may also be reduced regardless of the spacer margin SM therebetween.

The sidewall spacer structure may also be applied to the interconnect structure 100B shown in FIG. 1B as described below.

Figure 3A:
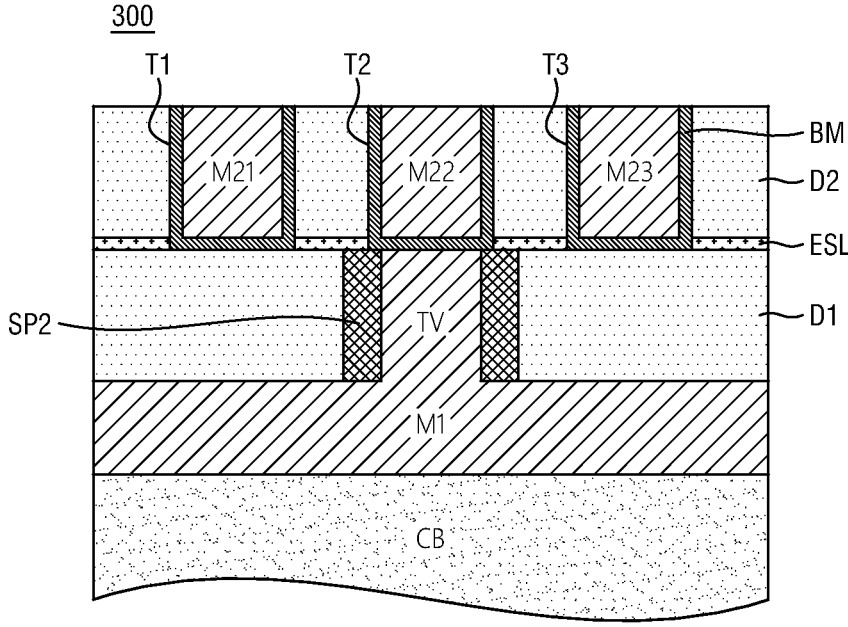
FIG. 3A illustrates a cross-sectional view of an interconnect structure in which a metal pattern is aligned with an under-layer top via having a spacer structure on a sidewall thereof, according to an embodiment.
Figure 3B:
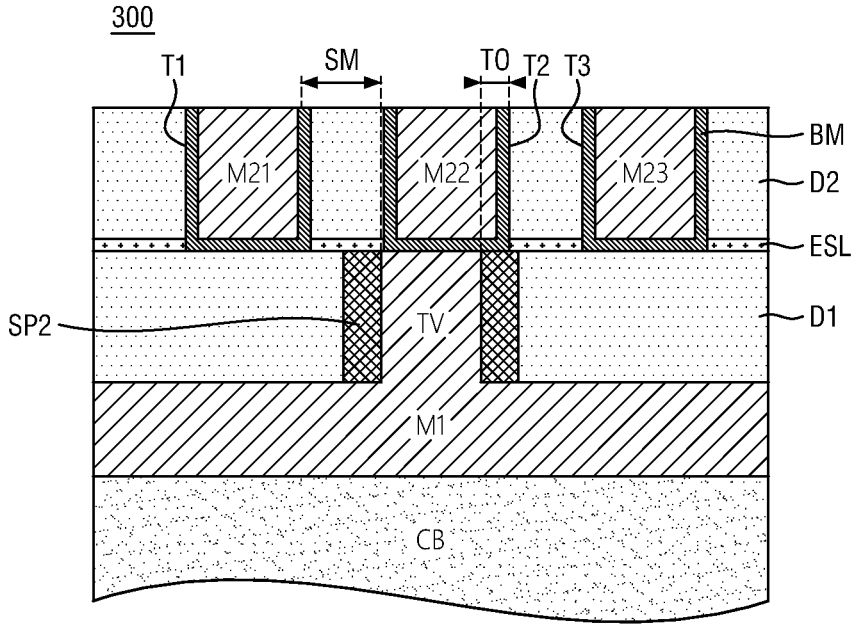
FIG. 3B illustrates a cross-sectional view of the interconnect structure of FIG. 3A in which the metal pattern is misaligned with the under-layer top via having the spacer structure on the sidewall thereof, according to an embodiment.

FIG. 3A illustrates a cross-sectional view of an interconnect structure in which a metal pattern is aligned with an under-layer top via having a spacer structure on a sidewall thereof, according to an embodiment. FIG. 3B illustrates a cross-sectional view of the interconnect structure of FIG. 3A in which the metal pattern is misaligned with the under-layer top via having the spacer structure on the sidewall thereof, according to an embodiment.

An interconnect structure 300 shown in FIG. 3A may include a metal pattern M1 on which a top via TV is protruded, a plurality of metal patterns M21-M23 in respective trenches T1-T3, a barrier metal layer BM, an etch stop layer ESL and ILD layers D1, D2, on a circuit block CB of an integrated circuit, which are the same or similar to those included in the interconnect structure 100B. These elements of the interconnect structure 300 may include the same or similar materials of the corresponding elements of the interconnect structure 100B. Further, these elements of the interconnect structure 300 may be formed in a manner that is the same as or similar to that used for the formation of the corresponding elements in the interconnect structure 100B. Thus, duplicate descriptions may be unnecessary herein.

However, according to an embodiment, the interconnect structure 300 may be characterized in that a spacer structure SP2 is formed on a sidewall of the top via TV in the ILD layer D1. Like the spacer structure SP1 of the interconnect structure 200, the spacer structure SP2 of the may also include a dielectric material such as silicon nitride (e.g., (e.g., SiN, Si₃N₄, SiCN, etc.) having a greater dielectric constant than the material included in the ILD layer D1 such as silicon oxide (e.g., SiO, SiO₂, etc.) not being limited thereto, according to an embodiment.

This sidewall spacer structure SP2 may be formed on the sidewall of the under-layer top via TV in the interconnect structure 300 to address the problems of misalignment between the metal pattern M22 and the top via TV of the interconnect structure 100B of FIG. 1B.

Thus, as shown in FIG. 3B, when the metal pattern M22 is formed to be misaligned with the under-layer top via TV in the single damascene operation, the same or similar trench offset TO generated in the interconnect structure 100B may be generated. However, as the spacer structure SP2 may be formed on the sidewall of the top via TV, the trench offset TO generated from misaligned trench etching (e.g., dry and/or wet etching) of the ILD layer D1 in a single damascene operation may be positioned above the spacer structure SP2. Further, the spacer structure SP2 may be formed of the dielectric material different from that of the ILD layer D1 as described above, it may have sufficient etch selectivity with respect to the ILD layer D1, so as to tolerate, without substantial damage, the trench etching of the ILD layer D1 in the single damascene operation for the trenches T1-T3.

Thus, a top surface of the ILD layer D1 may be protected from the misaligned trench etching. In other words, the spacer structure SP may prevent formation of the unintended groove on the ILD layer D1 by the trench etching that may occur in the interconnect structure 100B as shown in FIG. 1A. Accordingly, isolation characteristics of the ILD layer D1 may not be degraded due to the spacer structure SP2.

Moreover, as the spacer structure SP2 formed on the sidewall of the top via TV may reduce a possible short-circuit risk between the top via TV and the metal pattern 21 regardless of the spacer margin SM therebetween.

Figure 4A:
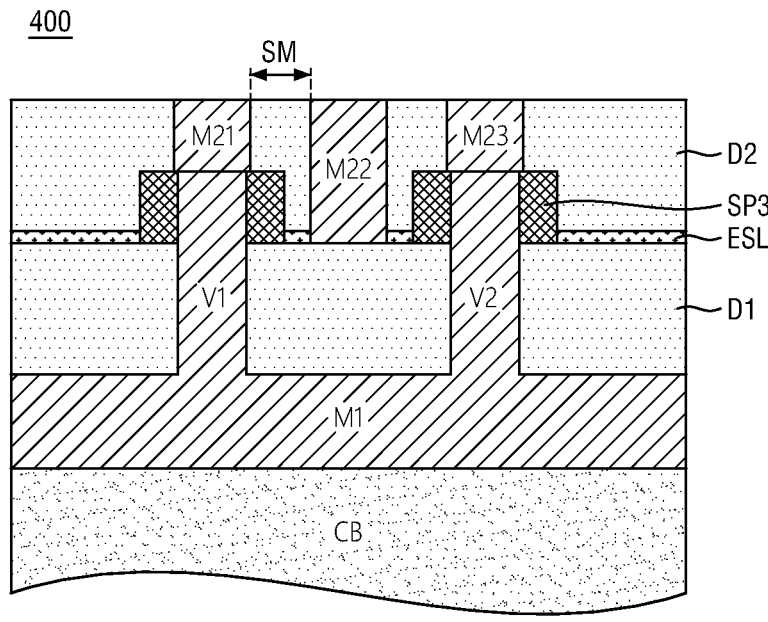
FIG. 4A illustrates a cross-sectional view of an interconnect structure in which a metal pattern is aligned with an under-layer via structure having a spacer structure on an upper sidewall thereof, according to an embodiment.
Figure 4B:
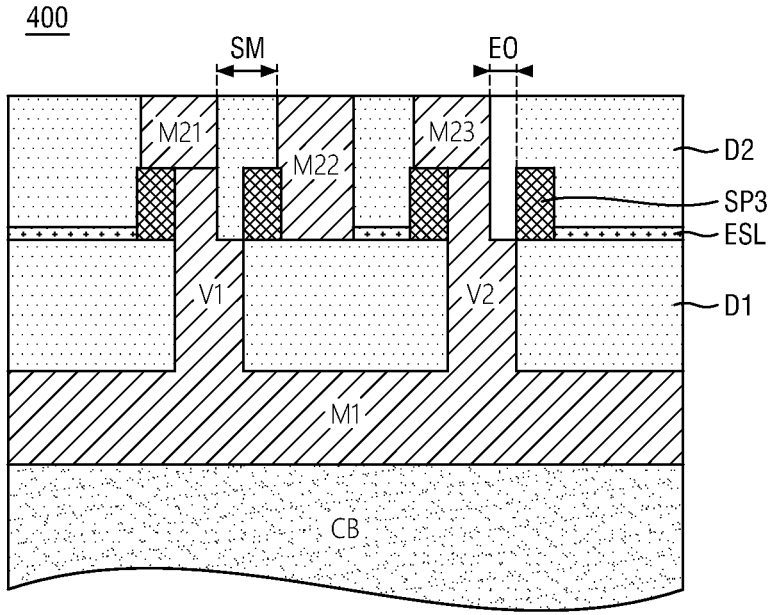
FIG. 4B illustrates a cross-sectional view of the interconnect structure of FIG. 4A in which the metal pattern is misaligned with the under-layer via structure having the spacer structure on the upper sidewall thereof, according to an embodiment.

FIG. 4A illustrates a cross-sectional view of an interconnect structure in which a metal pattern is aligned with an under-layer via structure having a spacer structure on an upper sidewall thereof, according to an embodiment. FIG. 4B illustrates a cross-sectional view of the interconnect structure of FIG. 4A in which the metal pattern is misaligned with the under-layer via structure having the spacer structure on the upper sidewall thereof, according to an embodiment.

An interconnect structure 400A shown in FIG. 4A may include a metal pattern M1, on which via structures V1 and V2 are provided in a protrusion form, and a plurality of metal patterns M21-M23, among which the metal patterns M21 and M23 are vertically connected to top surfaces of the via structures V1 and V2, respectively, according to an embodiment. A spacer structure SP3 may be formed on an upper sidewall of each of the via structures V1 and V2, according to an embodiment. This spacer structure SP3 will be further described later.

The interconnect structure 400A may be formed on a circuit block CB, which may be the same or similar to the circuit blocks CB shown in FIGS. 1A-1B, 2A-2B and 3A-3B, and thus, duplicate descriptions thereof are omitted herein.

The interconnect structure 400A may also include an ILD layer D1 formed on the metal pattern M1 to isolate the via structures V1 and V2 at their lower portions from other circuit elements. An ILD layer D2 may be formed above the ILD layer D1 to isolate the via structures V1 and V2 at their upper portions and the metal patterns M21-M23 from other circuit elements. Also, an etch stop layer ESL may remain on the ILD layer D1.

The metal pattern M1, M21-M23 and the via structure V1 and V2, the ILD layers D1 and D2, and the etch stop layer ESL in the interconnect structure 400A may be formed of the same or similar materials of the metal patterns, via, top via, ILD layers, etch stop layer in the interconnect structures 100A, 100B, 200 and 300 of FIGS. 1A-1B, 2A-2B and 3A-3B, and thus, duplicate descriptions thereof are omitted herein.

The interconnect structure 400A as shown in FIG. 4A may not have a barrier metal layer like the barrier metal layer BM included in the interconnect structures 100A, 100B, 200 and 300 of FIGS. 1A-1B, 2A-2B and 3A-3B. This is because the ILD layers D1 and D2 may be formed after formation of the metal pattern M1, M21-M23 and the via structure V1 and V2 in the interconnect structure 400A as will be described later. Further, the metal pattern M1 along with the via structures V1, V2 and the metal patterns M21-M23 may be formed of ruthenium (Ru), according to an embodiment.

FIG. 4A shows that the via structures V1 and V2 each takes a top via structure like the top via TV shown in FIGS. 1B and 2B. That is, the via structures V1 and V2 may be formed from the metal pattern M1 through photolithography and etching (e.g., dry and/or wet etching), not being limited thereto, and thus, the metal pattern M1 and the via structures V1 and V2 may be a single continuous structure without having a connection surface therebetween. However, although not shown in the drawings, the via structures V1 and V2 may be formed through a single or dual damascene operation in the interconnect structure 300A, according to an embodiment.

According to an embodiment, the via structures V1 and V2 may be formed across both of the ILD layers D1 and D2. For example, a lower portion of each of the via structures V1 and V2 may be surrounded by the ILD layer D1, and an upper portion thereof may be surrounded by the ILD layer D2.

According to an embodiment, the spacer structure SP3 may be formed on a sidewall of the upper portion thereof to secure an isolation space margin SM between the via structure V1 (or V2) and the adjacent metal pattern M22 in the same layer, that is, in the ILD layer D2.

Thus, as shown in FIG. 4B, when the metal patterns M21 and M23 are formed to be misaligned with the under-layer via structures V1 and V2, respectively, during the formation of the metal patterns M21-M23, for example, through photolithography and etching (e.g., dry and/or wet etching) operations, an etching offset EO may be generated, and the under-layer via structures V1 and V2 may be vertically etched to reduce its width by the etching offset EO. However, due to the spacer structure SP3, the isolation spacer margin SM may be maintained to reduce a short-circuit risk between the metal pattern 22 and the under-layer via structure V1 connected to the metal pattern 21.

In the present embodiment, the upper sidewall spacer structure SP3 is formed on the via structures V1 and V2, which are aligned with and connected to the metal patterns M21 and M23, respectively. However, the upper sidewall spacer structure SP3 may also be formed on a metal pattern in an interconnect structure. For example, an interconnect structure according to an embodiment may include two metal patterns replacing the metal pattern M1 and the via structures V1 and V2 in the interconnect structure 400, and two via structures replacing the metal patterns M21 and M22 in the interconnect structure 400. In this interconnect structure, the two metal patterns may have respective upper sidewall spacer structures thereon similar to the upper sidewall spacer structure SP3, and may be aligned with and connected to the two via structures thereabove.

The above embodiments describe in reference to FIGS. 1A-1B to 4A-4B that the metal patterns M1, M11-M13, top vias TV and via structures V1, V2 at a lower layer are formed without barrier metal layers. As described above, this is because these metal structures are first formed through, for example, by photolithography and etching, without using a damascene process. However, the disclosure is not limited thereto. These metal structures may also be formed through the damascene operation(s), according to embodiments.

Herebelow, methods of manufacturing the interconnect structures 200, 300 and 400 shown in FIGS. 2A-2B to 4A-4B according to embodiments are presented.

FIGS. 5A-5H illustrate cross-sectional views of intermediate or completed interconnect structures after corresponding steps of a method of manufacturing an interconnect structure including a metal pattern having a sidewall spacer structure, according embodiments. FIG. 6 illustrate a flowchart of the method of manufacturing the interconnect structure having the sidewall spacer structure, according to an embodiment.

The interconnect structure manufactured by the method described below in reference to FIGS. 5A-5H and FIG. 6 may be or correspond to the interconnect structure 200 shown in FIG. 2A. Thus, materials forming or included in various structures or elements of the intermediate or completed interconnect structures described below may be the same materials of those structures or elements of the interconnect structure 200, and duplicate descriptions thereof may be omitted herebelow. The same reference numbers used for the interconnect structure 200 in FIG. 2A may be used in the descriptions below.

Figure 5A:
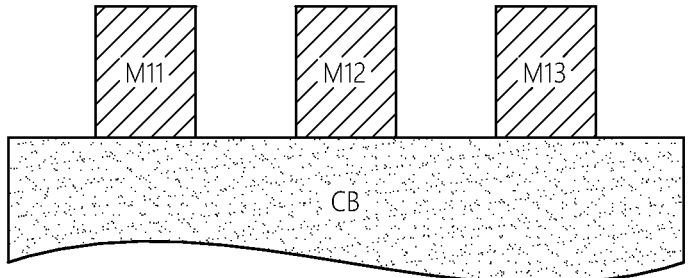
FIGS. 5A-5H illustrate cross-sectional views of intermediate or completed interconnect structures after corresponding steps of a method of manufacturing an interconnect structure including a metal pattern having a sidewall spacer structure, according embodiments, and FIG. 6 illustrate a flowchart of a method of manufacturing the interconnect structure having the sidewall spacer structure, according to an embodiment.

Referring to FIG. 5A, an initial metal structure including the plurality of metal patterns M11-M13 formed on the circuit block CB may be provided (S610 in FIG. 6).

As described earlier, the metal patterns M11-M13 may be formed of ruthenium (Ru), not being limited thereto, and the circuit block CB may be or include one or more FEOL or MOL elements.

Figure 5B:
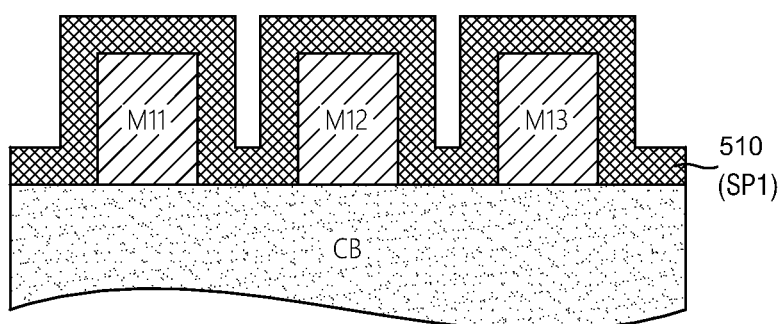

Referring to FIG. 5B, a spacer material 510 formed of a dielectric material(s) such as silicon nitride (e.g., SiN, $Si_3N_4$, SiCN, etc.) may be conformally layered on outer surfaces of the metal patterns M11-M13 and top surfaces of the circuit block CB exposed between the metal patterns M11-M13 (S620 in FIG. 6).

The conformal layering of the spacer material 510 may be performed through, for example, atomic layer deposition (ALD).

Figure 5C:
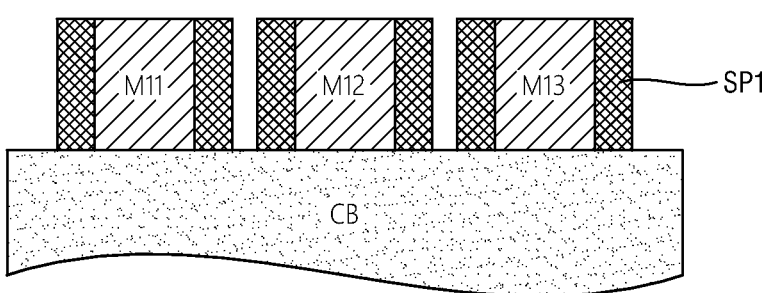

Referring to FIG. 5C, the spacer material 510 may be selectively removed at the top surfaces of the metal patterns M11-M13 through, for example, anisotropic dry etching such as reactive ion etching (RIE), not being limited thereto (S630 in FIG. 6).

By this selective removal operation, the spacer material 5410 may be removed from the top surfaces of the metal patterns M11-M13, but may remain on sidewalls of thereof, thereby forming the sidewall spacer structure SP1 on each of the metal patterns M11-M13.

Figure 5D:
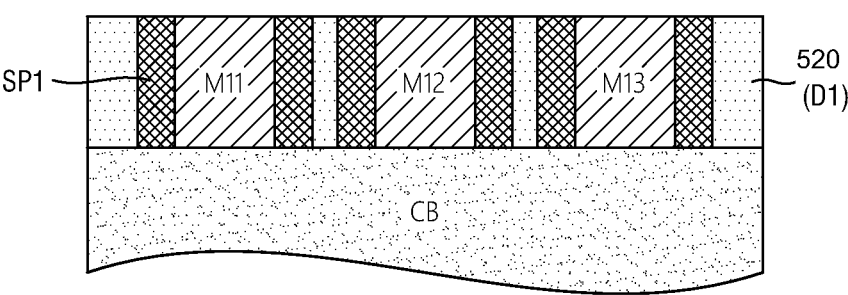

Referring to FIG. 5D, an ILD material 520 such as a low-k dielectric material(s) may be deposited on the intermediate interconnect structure obtained in the previous step through, for example, PVD, CVD, PECVD and/or electroplating, and planarized through, for example, chemical-mechanical planarization (CMP), thereby forming the ILD layer D1 (S640 in FIG. 6)

By the deposition and planarization operations in this step, the ILD layer D1 may be formed to enclose the metal patterns M11-M13 to isolate these metal patterns from other circuit element. Further, top surfaces of the ILD layer D1, the metal patterns M11-M13 and the spacer structure SP1 may be exposed and coplanar by the deposition and planarization in this step.

Figure 5E:
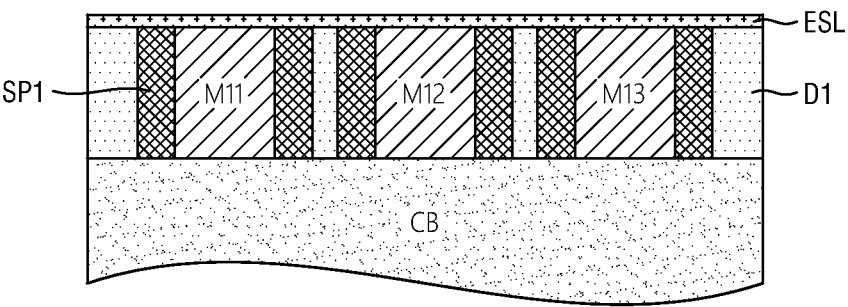

Referring to FIG. 5E, the etch stop layer ESL may be formed on a top surface of the intermediate interconnect structure obtained in the previous step, that is, the coplanar top surfaces of the ILD layer D1, the metal patterns M11-M13 and the spacer structure SP1 (S650 in FIG. 6).

Figure 5F:
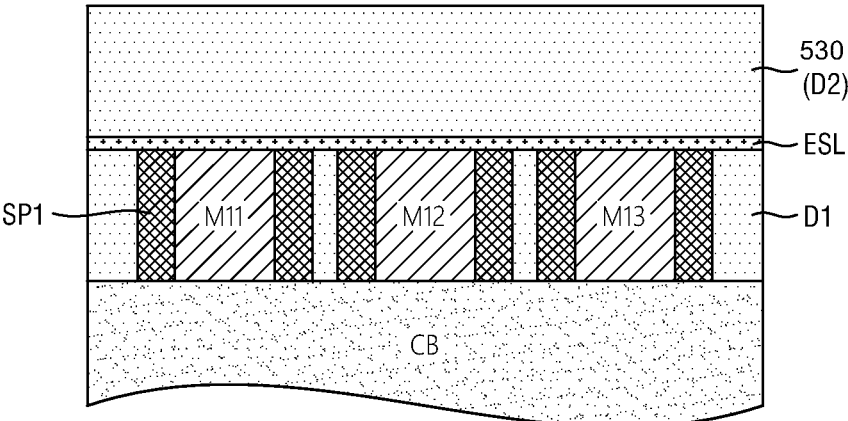

Referring to FIG. 5F, an ILD material 530 may be deposited on the etch stop layer ESL formed on the coplanar top surfaces of the ILD layer D1, the metal patterns M11-M13 and the spacer structure SP1, and planarized to form the ILD layer D2 (see S660 in FIG. 6).

The same or similar deposition and planarization applied to the formation of the ILD layer D1 in the previous step may be used in this step to obtain the ILD layer D2 above the ILD layer D1.

Figure 5G:
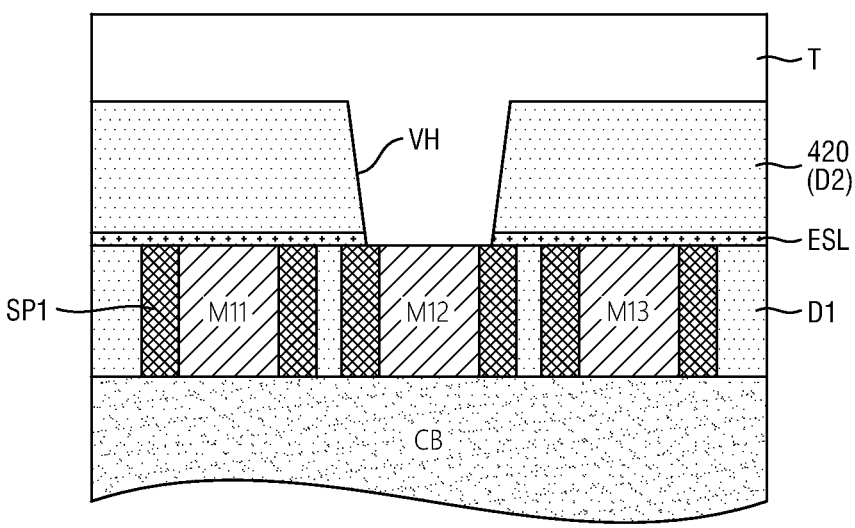

Referring to FIG. 5G, the ILD layer D2 may be patterned, for example, using a dual damascene operation including photolithography and etching (e.g., dry/wet etching) to form the trench T and the via hole VH (see S670 in FIG. 6).

The via hole VH may be formed to be aligned with a selected metal pattern among the metal patterns M11-M13, for example, the under-layer metal pattern M12 such that a bottom portion of the via hole VH may be contained within an outer profile of the spacer structure SP1 on the sidewalls of the metal pattern 12.

Figure 5H:
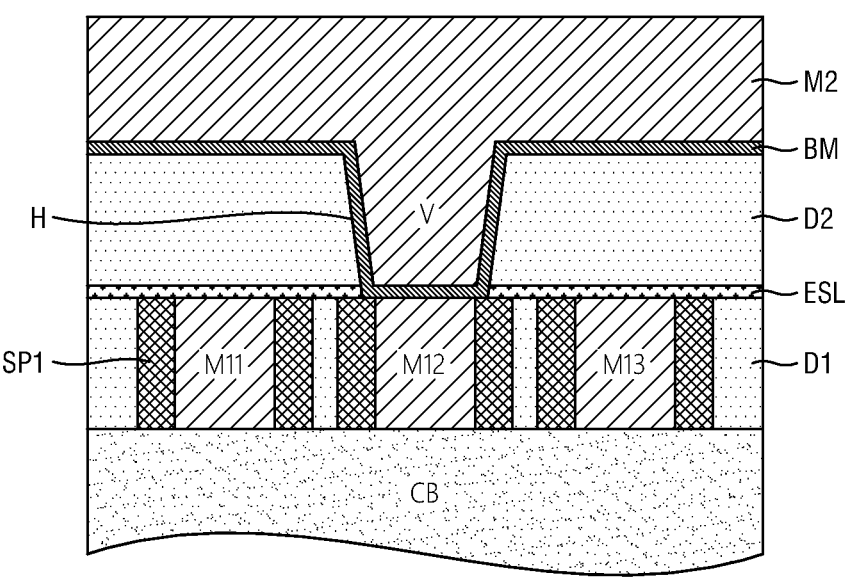

Referring to FIG. 5H, the barrier metal layer BM may be layered in the via hole VH and the trench T, for example, through ALD, and subsequently, the via V and the metal pattern M2 may be deposited on the barrier metal layer BM in the via hole VH and the trench T, respectively, for example, through PVD, CVD, PECVD and/or electroplating, thereby to form the interconnect structure 200 (see S680 in FIG. 6). Although not shown in the drawings, the barrier metal layer BM may be formed on a contact liner layered on the via hole VH and the trench T facilitating deposition of the metal pattern M2 therein.

FIGS. 7A-7H illustrate cross-sectional views of intermediate or completed interconnect structures after corresponding steps of a method of manufacturing an interconnect structure a top via having a sidewall spacer structure, according embodiments. FIG. 8 illustrate a flowchart of the method of manufacturing the interconnect structure, according to an embodiment.

The interconnect structure manufactured by the method described in reference to FIGS. 7A-7H and FIG. 8 may be or correspond to the interconnect structure 300 shown in FIG. 3A. Thus, materials forming or included in various structures or elements of the intermediate or completed interconnect structures described below may be the same materials of those structures or elements of the interconnect structure 300, and duplicate descriptions thereof may be omitted herebelow. The same reference numbers used for the interconnect structure 300 in FIG. 3A may be used in the descriptions below.

Figure 7A:
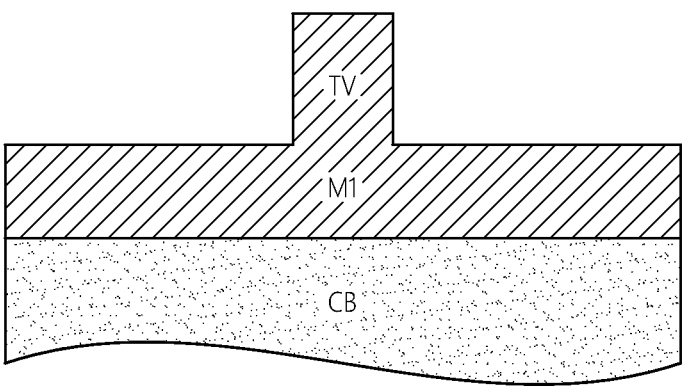
FIGS. 7A-7H illustrate cross-sectional views of intermediate or completed interconnect structures after corresponding steps of a method of manufacturing an interconnect structure a top via having a sidewall spacer structure, according embodiments, and FIG. 8 illustrate a flowchart of the method of manufacturing the interconnect structure, according to an embodiment.

Referring to FIG. 7A, an initial metal structure including the metal pattern M1 and the top via TV protruded from the metal pattern M1 may be provided on the circuit block CB (S810 in FIG. 8).

The metal patterns M1 and the top via TV may be formed, for example, by performing photolithography and etching (e.g., dry/wet etching) on ruthenium (Ru), not being limited thereto, and thus, may form a continuous metal structure without a connection surface therebetween. The circuit block CB may be or include one or more FEOL or MOL elements.

Figure 7B:
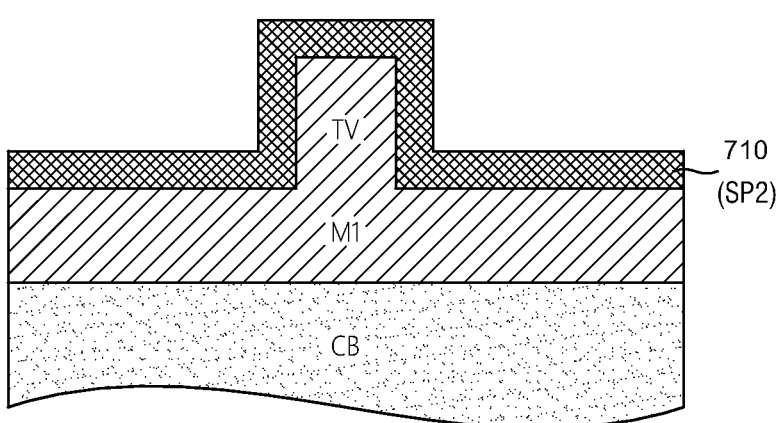

Referring to FIG. 7B, a spacer material 710 formed of a dielectric material(s) such as silicon nitride (e.g., SiN, $Si_3N_4$, SiCN, etc.) may be conformally layered on an outer surface of the top via TV and a top surface of the metal pattern M1 (S820 in FIG. 8). The conformal layering of the spacer material 710 may be performed through, for example, ALD.

Figure 7C:
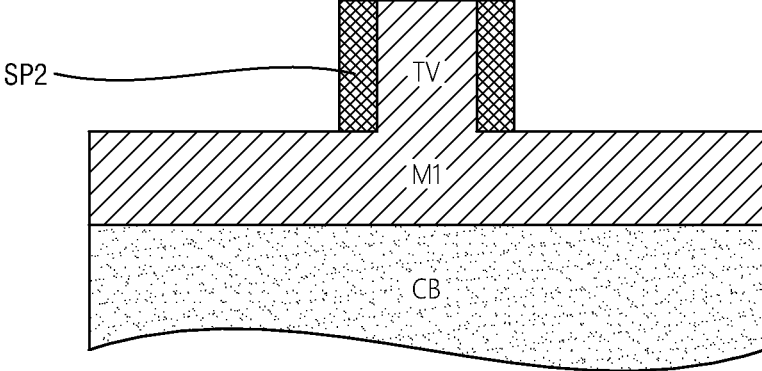

Referring to FIG. 7C, the spacer material 710 may be selectively removed at the top surfaces of the top via TV and the metal patterns M1 through, for example, anisotropic dry etching such as RIE, not being limited thereto (S830 in FIG. 8).

By this selective removal operation, the spacer material 710 may be removed from the top surfaces of the top via and the metal pattern M1, but may remain on a sidewall of the top via TV, thereby forming the sidewall spacer structure SP2 on the top via TV.

Figure 7D:
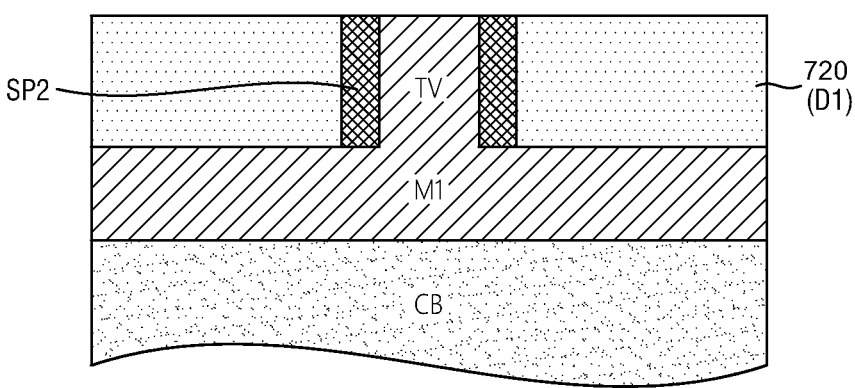

Referring to FIG. 7D, an ILD material 720 such as a low-k dielectric material(s) may be deposited on the intermediate interconnect structure obtained in the previous step through, for example, PVD, CVD, PECVD and/or electroplating, and planarized through, for example, CMP, thereby forming the ILD layer D1 (S840 in FIG. 8)

By the deposition and planarization operations in this step, the ILD layer D1 may be formed to enclose the top via TV and the metal pattern M1 to isolate these interconnect elements from other circuit element. Further, top surfaces of the ILD layer D1, the top via TV and the spacer structure SP1 may be exposed and coplanar.

Figure 7E:
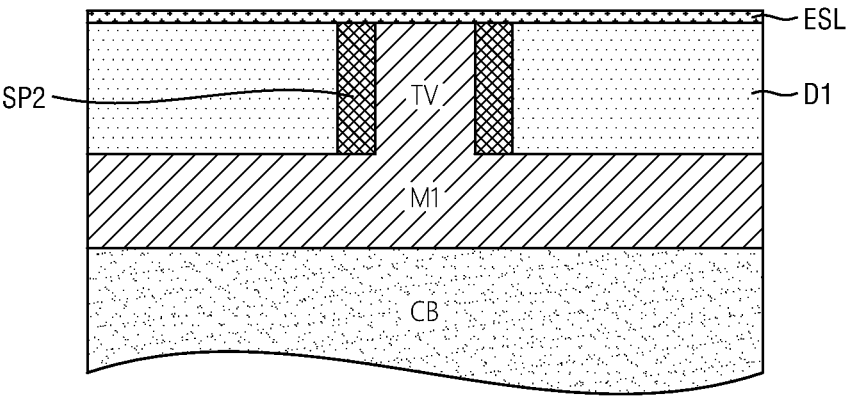

Referring to FIG. 7E, the etch stop layer ESL may be formed on a top surface of the intermediate interconnect structure obtained in the previous step, that is, the coplanar top surfaces of the ILD layer D1, the top via TV and the spacer structure SP2 (S850 in FIG. 8).

Figure 7F:
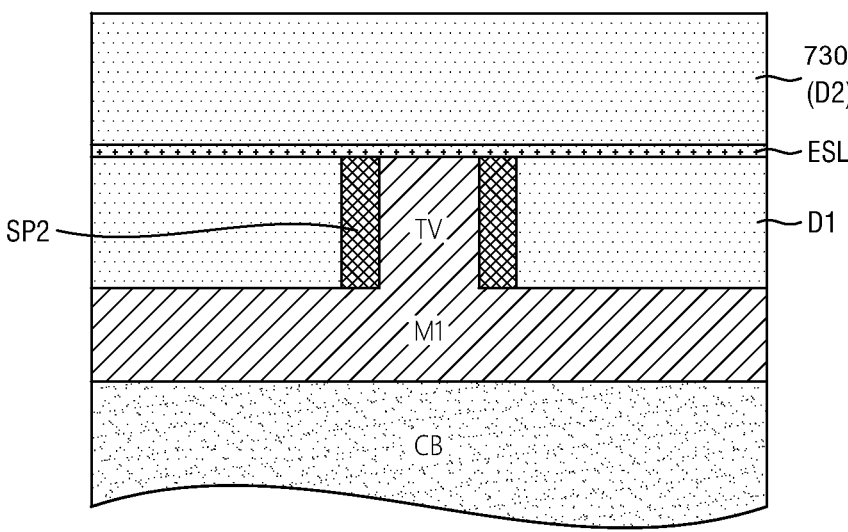

Referring to FIG. 7F, an ILD material 730 may be deposited on the etch stop layer ESL formed on the coplanar top surfaces of the ILD layer D1, the top via TV and the spacer structure SP2, and planarized to form the ILD layer D2 (see S860 in FIG. 8).

The same or similar deposition and planarization applied to the formation of the ILD layer D1 in the previous step may be used in this step to obtain the ILD layer D2 above the ILD layer D1.

Figure 7G:
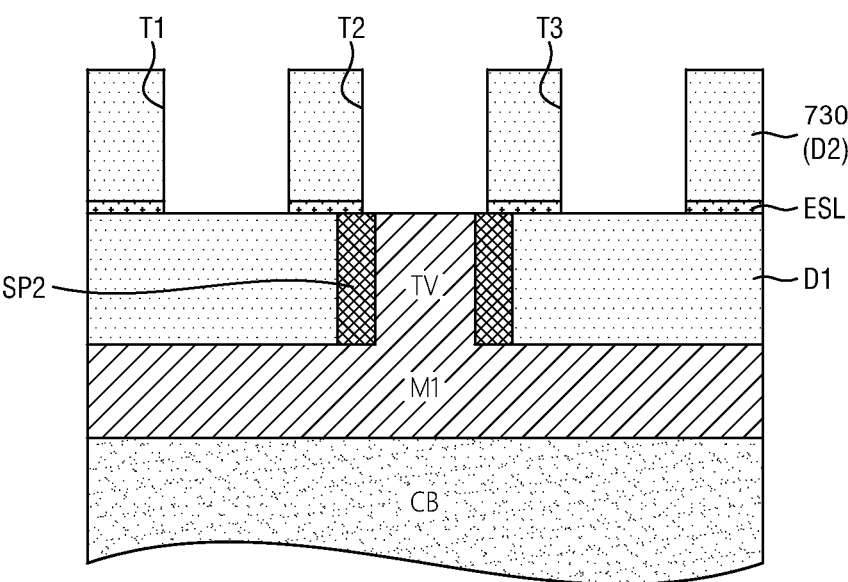

Referring to FIG. 7G, the ILD layer D2 may be patterned, for example, using a single damascene operation including photolithography and etching (e.g., dry/wet etching) to form the trenches T1-T3 (see S870 in FIG. 8).

Among the trenches T1-T3, the trench T2 may be formed to be aligned with the under-layer top via TV such that a bottom portion of the trench T2 may be contained within an outer profile of the spacer structure SP1 on the sidewall of the top via TV.

Figure 7H:
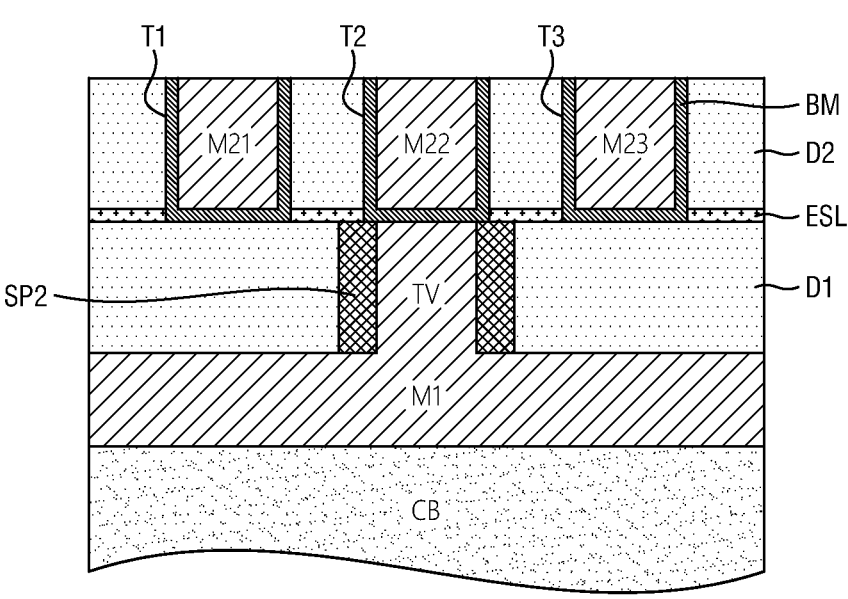

Referring to FIG. 7H, the barrier metal layer BM may be layered in the trenches T1-T3, for example, through ALD, and subsequently, the metal patterns M21-M23 may be deposited on the barrier metal layer BM in the trenches T1-T3, respectively, for example, through PVD, CVD, PECVD and/or electroplating, thereby to form the interconnect structure 300. Although not shown in the drawings, the barrier metal layer BM may be formed on a contact liner layered on the trenches T1-T3 facilitating deposition of the metal patterns M21-M23 therein.

FIGS. 9A-9G illustrate cross-sectional views of intermediate or completed interconnect structures after corresponding steps of a method of manufacturing an interconnect structure including a via structure having an upper-sidewall spacer structure, according embodiments. FIG. 10 illustrate a flowchart of the method of manufacturing the interconnect structure having the upper-sidewall spacer structure, according to an embodiment.

The interconnect structure manufactured by the method described in reference to FIGS. 9A-9G and FIG. 10 may be or correspond to the interconnect structure 400 shown in FIG. 4A. Thus, materials forming or included in various structures or elements of the intermediate or completed interconnect structures described below may be the same materials of those structures or elements of the interconnect structure 400, and duplicate descriptions thereof may be omitted herebelow. The same reference numbers used for the interconnect structure 400 in FIG. 4A may be used in the descriptions below.

Figure 9A:
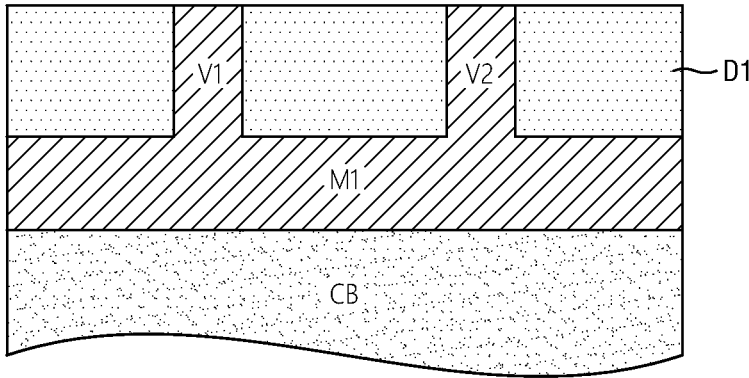
FIGS. 9A-9G illustrate cross-sectional views of intermediate or completed interconnect structures after corresponding steps of a method of manufacturing an interconnect structure including a via structure having an upper-sidewall spacer structure, according embodiments, and FIG. 10 illustrate a flowchart of the method of manufacturing the interconnect structure having the upper-sidewall spacer structure, according to an embodiment.

Referring to FIG. 9A, an initial metal structure including the metal pattern M1 and the via structure V1 and V2 protruded from the metal pattern M1 may be surrounded by an ILD layer D1 on the circuit block CB (S1010 in FIG. 10).

The ILD layer D1 may be formed by depositing an ILD material on the initial metal structure and planarizing the ILD material such that a top surfaces thereof is coplanar with top surfaces of the via structure V1 and V2 exposed through the ILD layer D1.

The metal patterns M1 and the via structures V1 and V2 may be formed, for example, by performing photolithography and etching (e.g., dry/wet etching) on ruthenium (Ru), not being limited thereto, and thus, may form a continuous metal structure without a connection surface therebetween. However, the via structures V1 and V2 may be formed through a single or dual damascene operation in the interconnect structure on the circuit block CB, according to an embodiment. The circuit block CB may be or include one or more FEOL or MOL elements.

Figure 9B:
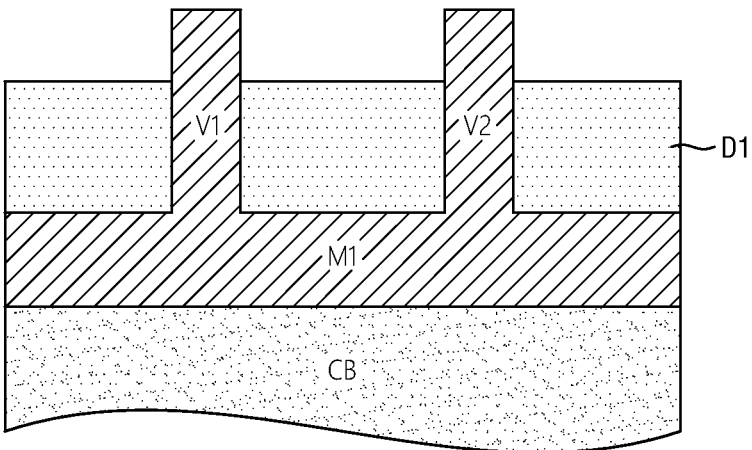

Referring to FIG. 9B, the ILD layer D may be partially etched down, for example, through dry etching such as RIE, not being limited thereto, such that each of the via structures V1 and V2 exposes its top surface and upper sidewall, while the lower sidewall thereof may remain surrounded by the ILD layer D1 (S1020 in FIG. 10).

Figure 9C:
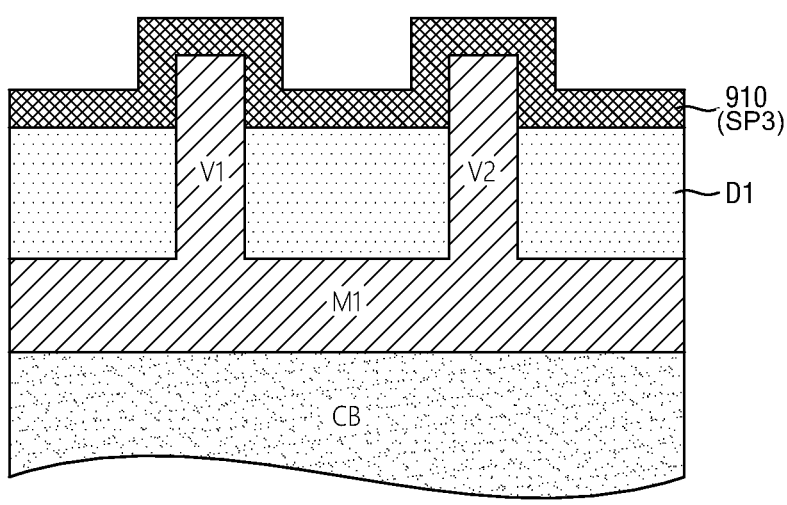

Referring to FIG. 9C, a spacer material 910 formed of a dielectric material(s) such as silicon nitride (e.g., SiN, $Si_3N_4$, SiCN, etc.) may be conformally layered on an outer surface (i.e., top surface and upper sidewall) of each of the via structures V1 and V2 and a top surface of the etched ILD layer D1. The conformal layering of the spacer material 910 may be performed through, for example, ALD (S1030 in FIG. 10).

Figure 9D:
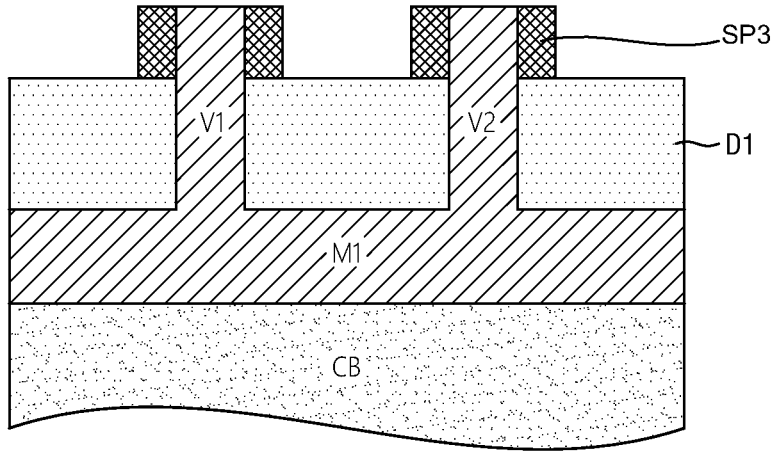

Referring to FIG. 9D, the spacer material 910 may be selectively removed at the top surfaces of the via structures V1, V2 and the etched ILD layer D1 through, for example, anisotropic dry etching such as RIE, not being limited thereto (S1040 in FIG. 10).

By this selective removal operation, the spacer material 910 may be removed from the top surfaces of the via structures V1, V2 and the etched ILD layer D1, but may remain on a sidewall of each of the via structures V1 and V2, thereby forming the upper-sidewall spacer structure SP3 thereof.

Figure 9E:
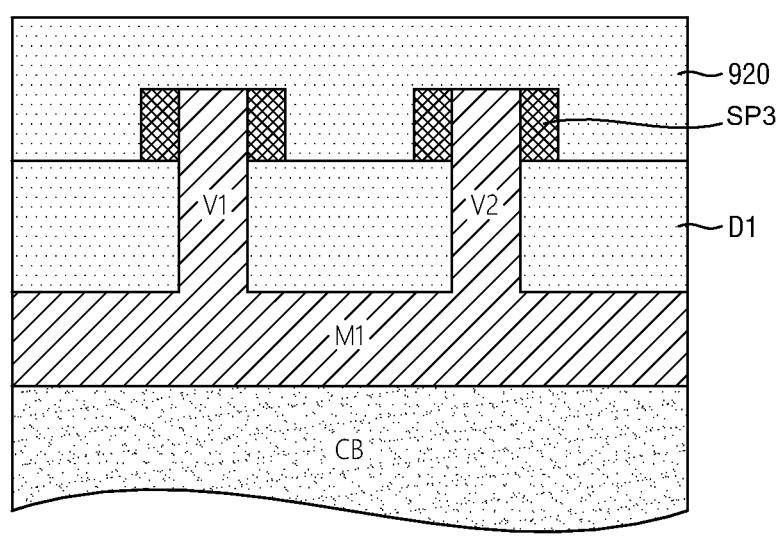

Referring to FIG. 9E, a metal material 920 such as ruthenium (Ru) may be deposited on the intermediate interconnect structure obtained in the previous step, and planarized (S1050 in FIG. 10).

The metal deposition in this step may be performed through, for example, PVD, CVD, PECVD and/or electroplating, and the metal planarization may be performed through, for example, CMP. The planarization of the deposited metal material 920 may be performed such that, after the planarization, top surfaces of the via structures V1 and V2 with the respective sidewall spacer structures SP3 are still covered by the metal material 920.

Figure 9F:
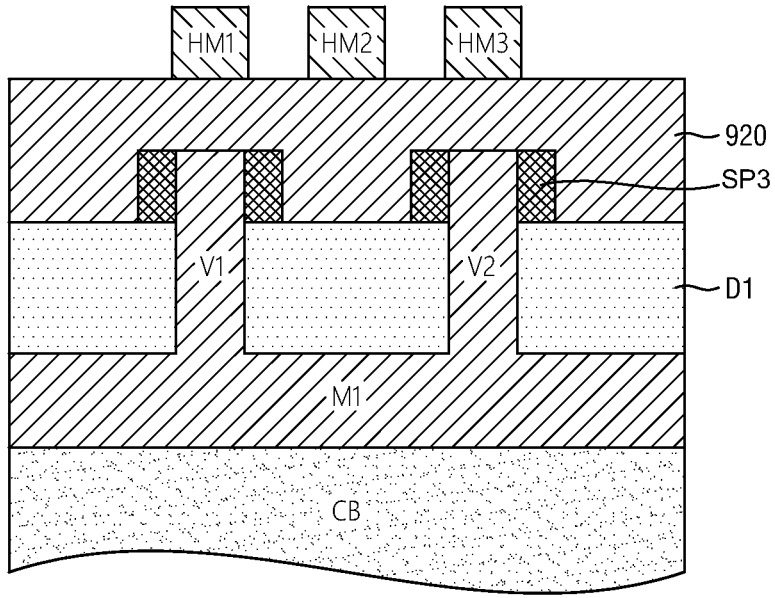

Referring to FIG. 9F, hard mask structures HM1-HM3 may be patterned on the metal material 920 planarized in the previous step at predetermined positions where corresponding metal patterns may be formed through an etching operation in a next step (S1060 in FIG. 10).

The hard mask structures HM1-HM3 may include titanium nitride (TiN) or silicon oxynitride (SiON), not being limited thereto. The hard mask patterning may be performed through photolithography, for example.

Figure 9G:
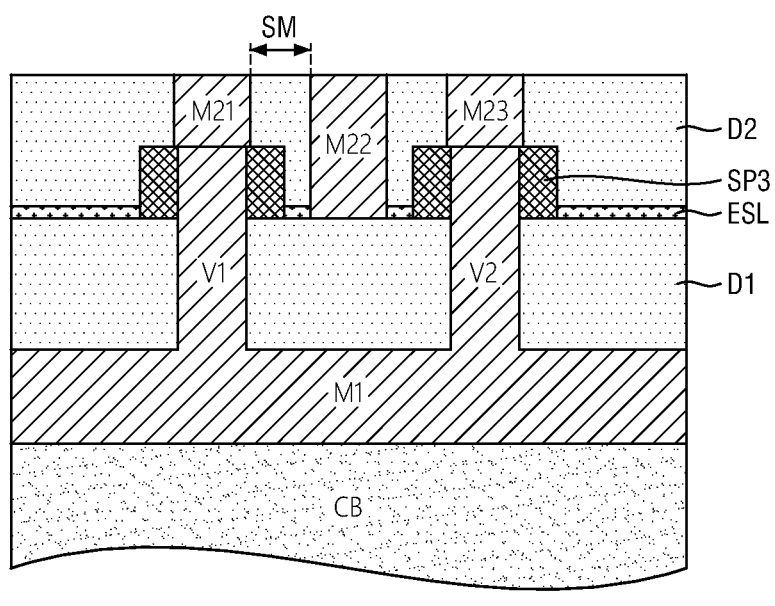

Referring to FIG. 9G, the metal patterns M21-M23 may be formed based on the hard mask patterns HM1-HM3 such that the metal patterns M21 and M23 are respectively aligned with the via structures V1 and V2 having the spacer structure SP3 on their upper sidewalls, and an ILD material 930 may be deposited to form an ILD layer D2, thereby to form the interconnect structure 400 (S1070 in FIG. 10).

The metal patterns M21-M23 may be obtained through, for example, dry etching such as RIE, not being limited thereto. The metal patterns M21-M23 and upper portions of the via structures V1 and V2 with the upper-sidewall spacer structure SP3 thereon may be surrounded by the ILD layer D2.

Thus far, various interconnect structures including a metal pattern having a sidewall spacer structure or a via structure having a sidewall spacer structure have been presented along with the methods of manufacturing the same, according to embodiments. As described, these interconnect elements having the sidewall spacer structure may be able to prevent generation of an unintended groove in an ILD layer during formation of a misaligned trench or via hole in an upper-layer ILD layer, thereby to protect the ILD layer. These interconnect elements may also reduce a void risk that may occur when the misaligned trench or via hole is not sufficiently filled in with a metal material because of the misalignment and the groove in the ILD layer. Further, due to the sidewall spacer structure, the interconnect elements may maintain an isolation margin with respect to an under-layer interconnect element even when misalignment occurs.

Figure 11:
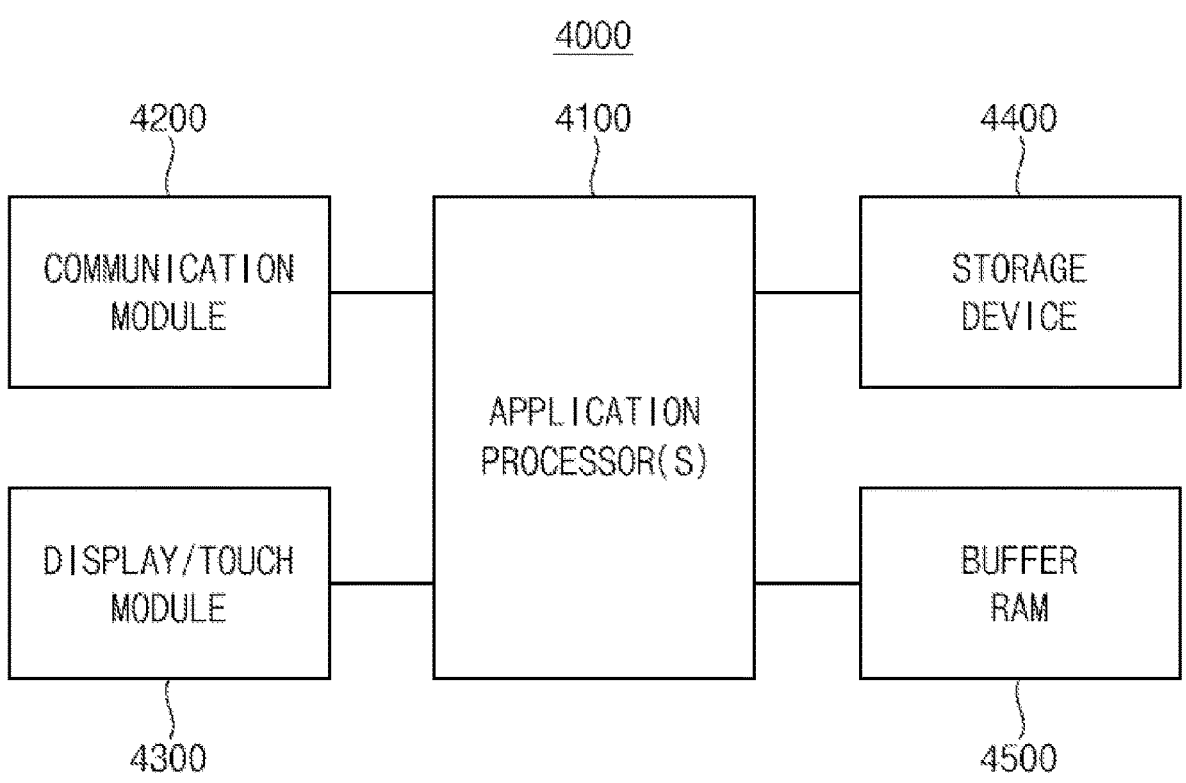
FIG. 11 is a schematic block diagram illustrating an electronic device including a semiconductor device in which at least one of the interconnect structure 200, 300 and 400 shown in FIGS. 2A-2B, 3A-3B and 4A-4B, respectively, is used, according to an example embodiment.

FIG. 11 is a schematic block diagram illustrating an electronic device including a semiconductor device in which at least one of the interconnect structure 200, 300 and 400 shown in FIGS. 2A-2B, 3A-3B and 4A-4B, respectively, is used, according to an example embodiment.

Referring to FIG. 11, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 may be implemented to perform wireless or wire communications with an external device. The display/touch module 4300 may be implemented to display data processed by the application processor 4100 and/or to receive data through a touch panel. The storage device 4400 may be implemented to store user data. The storage device 4400 may be an embedded multimedia card (eMMC), a solid state drive (SSD), a universal flash storage (UFS) device, etc., not being limited thereto. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), ferroelectric RAM (FeRAM), etc.

At least one component in the electronic device 4000 may include at least one of the interconnect structure 200, 300 and 400 shown in FIGS. 2A-2B, 3A-3B and 4A-4B, respectively, according to embodiments.

The foregoing is illustrative of example embodiments and is not to be construed as limiting the disclosure. Although a number of example embodiments have been described, those skilled in the art will readily appreciate that many modifications are possible in the above embodiments without materially departing from the disclosure.

What is claimed is:

1. A semiconductor device comprising at least one front-end-of line (FEOL) element connected to an interconnect structure, the interconnect structure comprising:

a 1$^{st}$ metal pattern or via structure with a spacer structure on a sidewall thereof, the spacer structure directly contacting the sidewall of the 1$^{st}$ metal pattern or via structure;

a 1$^{st}$ interlayer dielectric (ILD) layer formed at sides of the 1$^{st}$ metal pattern or via structure with the spacer structure on the sidewall thereof;

a 2$^{nd}$ via structure or metal pattern overlaps the 1$^{st}$ metal pattern or via structure in a vertical direction perpendicular to a bottom surface of the 1$^{st}$ metal pattern or via structure;

a barrier metal layer on sidewalls of the 2$^{nd}$ via structure or metal pattern;

an etch stop layer that extends in a horizontal direction parallel to the bottom surface of the 1$^{st}$ metal pattern or via structure, wherein the spacer structure comprises a dielectric material different from a material included in the 1$^{st}$ ILD layer, wherein a lower side edge of the 2$^{nd}$ via structure or metal pattern overlaps a sidewall portion of the spacer structure that extends in the vertical direction, wherein each of the sidewalls of the barrier metal layer extends in the vertical direction and has respective widths that are less than a width of the sidewall portion of the spacer structure, wherein the etch stop layer contacts a sidewall of the spacer structure, wherein a height of the spacer structure is greater than a height of the etch stop layer in a vertical direction perpendicular to the 1$^{st}$ metal pattern or via structure, wherein a 2$^{nd}$ ILD layer directly contacts a top surface of the etch stop layer, directly contacts a sidewall of the 1$^{st}$ metal pattern or via structure, and directly contacts a sidewall of the spacer structure, and wherein the 2$^{nd}$ via structure or metal pattern contacts a portion of a top surface of the spacer structure and contacts a top portion of the 1$^{st}$ metal pattern or via structure.

2. The semiconductor device of claim 1, wherein the dielectric material of the spacer structure has a dielectric constant greater than that of a material included in the 1$^{st}$ ILD layer.

3. The semiconductor device of claim 2, wherein the dielectric material of the spacer structure comprises silicon nitride, and the material included in the 1$^{st}$ ILD layer comprises silicon oxide.

4. The semiconductor device of claim 1, wherein the 2$^{nd}$ via structure or metal pattern is vertically aligned with and connected to the 1$^{st}$ metal pattern or via structure, respectively.

5. The semiconductor device of claim 4, wherein the 2$^{nd}$ via structure or metal pattern is formed in a via hole or trench in which the barrier metal layer including a material different from the dielectric material of the spacer structure is formed.

6. The semiconductor device of claim 5, wherein the 1$^{st}$ metal pattern or via structure with the spacer structure on the sidewall thereof is formed in the 1$^{st}$ ILD layer without a barrier metal layer therebetween.

7. The semiconductor device of claim 1, wherein the 1$^{st}$ metal pattern or via structure is a top via formed on a base metal pattern in a protrusion form without a connection surface therebetween.

8. The semiconductor device of claim 1, wherein the spacer structure is formed on an upper portion of the sidewall of the 1$^{st}$ metal pattern or via structure.

9. The semiconductor device of claim 8, wherein a lower portion of the sidewall of the 1$^{st}$ metal pattern or via structure is surrounded by a 2$^{nd}$ ILD layer, and wherein the 2$^{nd}$ ILD layer surrounding the lower portion of the sidewall of the 1$^{st}$ metal pattern or via structure is separated from the 1$^{st}$ ILD layer formed at the sides of the 1$^{st}$ metal pattern or via structure with the spacer structure on the upper portion of the sidewall thereof.

10. The semiconductor device of claim 1, wherein the 2$^{nd}$ via structure or metal pattern is formed in the 1$^{st}$ ILD layer.

11. A semiconductor device comprising at least one front-end-of line (FEOL) element connected to an interconnect structure, the interconnect structure comprising:

a 1$^{st}$ metal pattern or via structure with a spacer structure on and directly contacting a sidewall thereof; and a 2$^{nd}$ via structure or metal pattern overlaps the 1$^{st}$ metal pattern or via structure in a vertical direction perpendicular to a bottom surface of the 1$^{st}$ metal pattern or via structure, and a barrier metal layer on sidewalls of the 2$^{nd}$ via structure or metal pattern;

an etch stop layer that extends in a horizontal direction parallel to the bottom surface of the 1$^{st}$ metal pattern or via structure, wherein the spacer structure is formed between the sidewall of the 1$^{st}$ metal pattern or via structure and an isolation structure formed of a material different from a material forming the spacer structure, wherein a lower side edge of the 2$^{nd}$ via structure or metal pattern overlaps a sidewall of the spacer structure in the vertical direction, wherein the sidewall of the spacer structure extends in the vertical direction, wherein each of sidewalls of the barrier metal layer has respective widths that are less than respective widths of the sidewalls of the spacer structure, wherein the etch stop layer contacts a sidewall of the spacer structure, wherein a height of the spacer structure is greater than a height of the etch stop layer in a vertical direction perpendicular to the 1$^{st}$ metal pattern or via structure, wherein a 2$^{nd}$ ILD layer directly contacts a top surface of the etch stop layer, directly contacts a sidewall of the 1$^{st}$ metal pattern or via structure, and directly contacts a sidewall of the spacer structure, and wherein the 2$^{nd}$ via structure or metal pattern contacts a portion of a top surface of the spacer structure and contacts a top portion of the 1$^{st}$ metal pattern or via structure.

12. The semiconductor device of claim 11, wherein the material forming the spacer structure has a dielectric constant greater than that of the material forming the isolation structure.

13. The semiconductor device of claim 11,
  wherein the $2^{nd}$ via structure or metal pattern is vertically aligned with and connected to the $1^{st}$ metal pattern or via structure, respectively.

14. The semiconductor device of claim 13, wherein the spacer structure is formed on an upper portion, among the upper portion and a lower portion, of the sidewall of the $1^{st}$ metal pattern or via structure.

15. The semiconductor device of claim 1, wherein both sidewalls of the barrier metal layer extend in the vertical direction and overlap sidewalls of the spacer structure in the vertical direction.

16. The semiconductor device of claim 1, wherein the sidewall of the spacer structure extends in the vertical direction.

17. The semiconductor device of claim 1, wherein the etch stop layer is in contact with a lower portion of a sidewall of the barrier metal layer.

18. The semiconductor device of claim 1, wherein the top surface of the spacer structure is in contact with both the etch stop layer and a bottom portion of the barrier metal layer.

19. The semiconductor device of claim 1, wherein a bottom surface of the etch stop layer is aligned with a bottom surface of the barrier metal layer in the horizontal direction, and
  wherein a top surface of the etch stop layer is aligned with a bottom surface of the $2^{nd}$ via structure or metal pattern in the horizontal direction.

20. A semiconductor device comprising at least one front-end-of line (FEOL) element connected to an interconnect structure, the interconnect structure comprising:

a $1^{st}$ metal pattern or via structure with a spacer structure on a sidewall thereof, the spacer structure directly contacting the sidewall of the $1^{st}$ metal pattern or via structure;

a $1^{st}$ interlayer dielectric (ILD) layer formed at sides of the $1^{st}$ metal pattern or via structure with the spacer structure on the sidewall thereof;

a $2^{nd}$ via structure or metal pattern overlaps the $1^{st}$ metal pattern or via structure in a vertical direction perpendicular to a bottom surface of the $1^{st}$ metal pattern or via structure;

a barrier metal layer on sidewalls of the $2^{nd}$ via structure or metal pattern;

an etch stop layer that extends in a horizontal direction parallel to the bottom surface of the $1^{st}$ metal pattern or via structure, wherein the spacer structure comprises a dielectric material different from a material included in the $1^{st}$ ILD layer, wherein a lower side edge of the $2^{nd}$ via structure or metal pattern overlaps a sidewall portion of the spacer structure that extends in the vertical direction, wherein each of the sidewalls of the barrier metal layer extends in the vertical direction and has respective widths that are less than a width of the sidewall portion of the spacer structure, wherein the etch stop layer extends on a top surface of the spacer structure, and wherein the $1^{st}$ ILD layer is between the etch stop layer and the spacer structure and directly contacts an entirety of the sidewall of the spacer structure.

* * * * *